(12) United States Patent
Lim et al.

(10) Patent No.: US 11,163,023 B2
(45) Date of Patent: Nov. 2, 2021

(54) MAGNETIC DEVICE

(71) Applicant: KOREA UNIVERSITY RESEARCH AND BUSINESS FOUNDATION, Seoul (KR)

(72) Inventors: Sang Ho Lim, Namyangju-si (KR); Si Nyeon Kim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 173 days.

(21) Appl. No.: 16/446,962

(22) Filed: Jun. 20, 2019

(65) Prior Publication Data
US 2019/0339341 A1 Nov. 7, 2019

Related U.S. Application Data

(63) Continuation of application No. PCT/KR2019/003114, filed on Mar. 18, 2019.

(30) Foreign Application Priority Data

Apr. 17, 2018 (KR) .................. 10-2018-0044205

(51) Int. Cl.
*G01R 33/09* (2006.01)
*G11B 5/39* (2006.01)
*H01F 1/04* (2006.01)

(52) U.S. Cl.
CPC .............. *G01R 33/093* (2013.01); *H01F 1/04* (2013.01)

(58) Field of Classification Search
CPC ......... B82Y 25/00; B82Y 10/00; B82Y 40/00; H01L 43/08; H01L 43/12; H01L 43/10; G01R 33/093; G01R 33/098
See application file for complete search history.

(56) References Cited

U.S. PATENT DOCUMENTS 6,597,547 B1 7/2003 Kawawake et al.
6,738,236 B1 5/2004 Mao et al.
(Continued)

FOREIGN PATENT DOCUMENTS

CN 1329742 A 1/2002
CN 101297371 A 10/2008
(Continued)

OTHER PUBLICATIONS

International Search Report dated Jul. 2, 2019 in counterpart International Patent Application No. PCT/KR2019/003114 (3 pages in Korean).

(Continued)

*Primary Examiner* — Alesa Allgood
(74) *Attorney, Agent, or Firm* — NSIP Law

(57) ABSTRACT

A magnetic device includes a pinned layer having an in-plane magnetization direction; a free layer, having an in-plane magnetization direction, vertically spaced apart from the pinned layer to be aligned with the pinned layer; a conductive spacer layer disposed between the pinned layer and the free layer; an antiferromagnetic layer disposed to fin the magnetization direction of the pinned layer and vertically spaced apart from the pinned layer to be aligned with the pinned layer; and a noble metal spacer layer disposed between the pinned layer and the antiferromagnetic layer.

18 Claims, 23 Drawing Sheets

(56) References Cited

U.S. PATENT DOCUMENTS

| | | | |
|---|---|---|---|
| 7,081,658 B2* | 7/2006 | Worledge | B82Y 25/00 257/295 |
| 7,859,034 B2 | 12/2010 | Huai et al. | |
| 2004/0004261 A1* | 1/2004 | Takahashi | G11B 5/3903 257/414 |
| 2010/0072524 A1 | 3/2010 | Huai et al. | |
| 2014/0110804 A1* | 4/2014 | Han | H01L 43/02 257/421 |
| 2017/0212188 A1* | 7/2017 | Kikitsu | G01R 33/091 |

FOREIGN PATENT DOCUMENTS

| | | |
|---|---|---|
| CN | 101523503 A | 9/2009 |
| CN | 103109322 A | 5/2013 |
| CN | 105449096 A | 3/2016 |
| JP | 2000-242913 A | 9/2000 |
| JP | 2000-338211 A | 12/2000 |
| JP | 2003-8104 A | 1/2003 |
| JP | 2003-124540 A | 4/2003 |
| JP | 2009-509357 A | 3/2009 |
| JP | 2010-129105 A | 6/2010 |
| KR | 10-2014-0120451 A | 10/2014 |
| KR | 10-1446334 B1 | 10/2014 |
| WO | WO 2010/029684 A1 | 3/2010 |
| WO | WO 2015/033464 A1 | 3/2015 |

OTHER PUBLICATIONS

Chinese Office Action dated Jan. 6, 2021 in counterpart Chinese Patent Application No. 201980001174.0 (6 pages in Chinese).
Chinese Office Action dated Jun. 23, 2021 in counterpart Chinese Patent Application No. 201980001174.0 (7 pages in Chinese).

* cited by examiner

MAGNETIC DEVICE

CROSS-REFERENCE TO RELATED APPLICATIONS

This application is a continuation of and claims priority to PCT/KR2019/003114 filed on Mar. 18, 2019, which claims priority to Korea Patent Application No. 10-2018-0044205 filed on Apr. 17, 2018, the entireties of which are both hereby incorporated by reference.

TECHNICAL FIELD

The present disclosure relates to magnetic device and, more particularly, to a magnetic device using a giant magnetic resistance effect or a magnetic device having a tunnel magnetic resistance effect, which includes an ultra-thin noble metal spacer layer inserted between an antiferromagnetic layer and a pinned layer.

BACKGROUND

A giant magnetoresistance (GMR) effect is a phenomenon in which an electrical resistance decreases when magnetization directions of a free layer and a pinned layer are parallel to each other in a spin valve structure, and increases when the magnetization directions of the free and pinned layers are antiparallel to each other. The GMR effect is an important core technology used in magnetic sensors such as a biosensor, a hard disk reader head sensor, and a vibration sensor in a microelectromechanical system (MEMS). A giant magnetoresistance (GMR) element may be used as a magnetic sensor.

SUMMARY

An aspect of the present disclosure is to provide a magnetic device which suppresses a signal generated by an external magnetic field along an easy direction of a magnetization in a magnetic sensor having a Wheatstone bridge structure and increases a signal sensitivity depending on an external magnetic field along a hard direction of the magnetization.

Another aspect of the present disclosure is to provide a magnetic device which increases a sensing range for an external magnetic field along a hard direction of a magnetization in a magnetic sensor having a Wheatstone bridge structure.

According to an aspect of the present disclosure, a magnetic device includes a pinned layer having an in-plane magnetization direction; a free layer, having an in-plane magnetization direction, vertically spaced apart from the pinned layer to be aligned with the pinned layer; a conductive spacer layer disposed between the pinned layer and the free layer; an antiferromagnetic layer disposed to pin the magnetization direction of the pinned layer and vertically spaced apart from the pinned layer to be aligned with the pinned layer; and a noble metal spacer layer disposed between the pinned layer and the antiferromagnetic layer.

In an example embodiment, the noble metal spacer layer may be a single-layer thin film of copper or platinum, or a multilayer thin film of copper and platinum, and may have a thickness of 0.1 to 0.8 nanometer (nm).

In an example embodiment, the free layer may have shape magnetic anisotropy, and the magnetic device may be connected with a Wheatstone bridge structure.

In an example embodiment, the conductive spacer layer may include copper and may have a thickness of 2.2 nm.

In an example embodiment, the noble metal spacer layer may include $Pt_2Cu_1$, $Cu_2Pt_1$, or $Cu_3Pt_2$, where each subscript denotes a thickness of an Angstrom unit.

In an example embodiment, the pinned layer may include CoFe, and the free layer may include a first ferromagnetic layer of NiFe and a second ferromagnetic layer of CoFe.

According to an aspect of the present disclosure, a magnetic device includes a pinned layer having an in-plane magnetization direction; a free layer, having an in-plane magnetization direction, vertically spaced apart from the pinned layer to be aligned with the pinned layer; a tunnel insulating layer disposed between the pinned layer and the free layer; an antiferromagnetic layer disposed to pin the magnetization direction of the pinned layer and vertically spaced apart from the pinned layer to be aligned with the pinned layer; and a noble metal spacer layer disposed between the pinned layer and the antiferromagnetic layer.

In an example embodiment, the noble metal spacer layer may be a single-layer thin film of copper or platinum, or a multilayer thin film of copper and platinum, and may have a thickness of 0.1 to 0.8 nanometer (nm).

In an example embodiment, the free layer may have shape magnetic anisotropy, and the magnetic device may be connected with a Wheatstone bridge structure.

In an example embodiment, the tunnel insulating layer may include MgO, AlOx, or GdOx.

In an example embodiment, the noble metal spacer layer may include $Pt_2Cu_1$, $Cu_2Pt_1$, or $Cu_3Pt_2$, where each subscript denotes a thickness of an Angstrom unit.

In an example embodiment, the pinned layer nay includes CoFe, and the free layer may include a first ferromagnetic layer of NiFe and a second ferromagnetic layer of CoFe.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

A giant magnetoresistance (GMR) magnetic sensor has characteristics of improved signal-to-noise ratio and thermal stability. When a thin film of a spin valve structure is provided in the form of a Wheatstone push-pull bridge pattern, a unipolar signal is converted into a bipolar signal. On this fact, a GMR magnetic sensor is used as a magnetic sensor. When a magnetic field is applied in a magnetic hard axis direction of a free layer, a non-hysteresis curve is also observed. Use of this fact may allow linear characteristics of a sensor to be secured. A slope or a sensitivity value, appearing in a low magnetic field region in a magnetic hard axis direction, is a significantly important factor to affect sensitivity characteristics of the GMR sensor. The sensitivity value, appearing in a low magnetic field region in a magnetic hard axis direction, is required to increase. In addition, when a magnetic easy axis signal is generated by a magnetic field in a magnetic easy axis direction, a magnetic hard axis signal, generated by a magnetic field in a magnetic hard axis direction, overlaps the magnetic easy axis signal to be distorted. Accordingly, there is need for a method of suppressing a magnetic easy axis signal, generated by a magnetic field in a magnetic easy axis direction, within a sensing range to be measured.

In a tunnel magnetoresistance magnetic sensor, when a magnetic easy axis signal is generated by the magnetic field in the magnetic easy axis direction in the same manner, the magnetic hard axis signal, generated by the magnetic field in the magnetic hard axis direction, is distorted.

According to an example embodiment, a noble metal spacer layer may be inserted between a pinned layer and an antiferromagnetic layer of a magnetoresistance element to inhibit a magnetic easy axis signal, generated by a magnetic field in a magnetic easy axis direction, within a range of a magnetic field.

Embodiments of the present disclosure will now be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
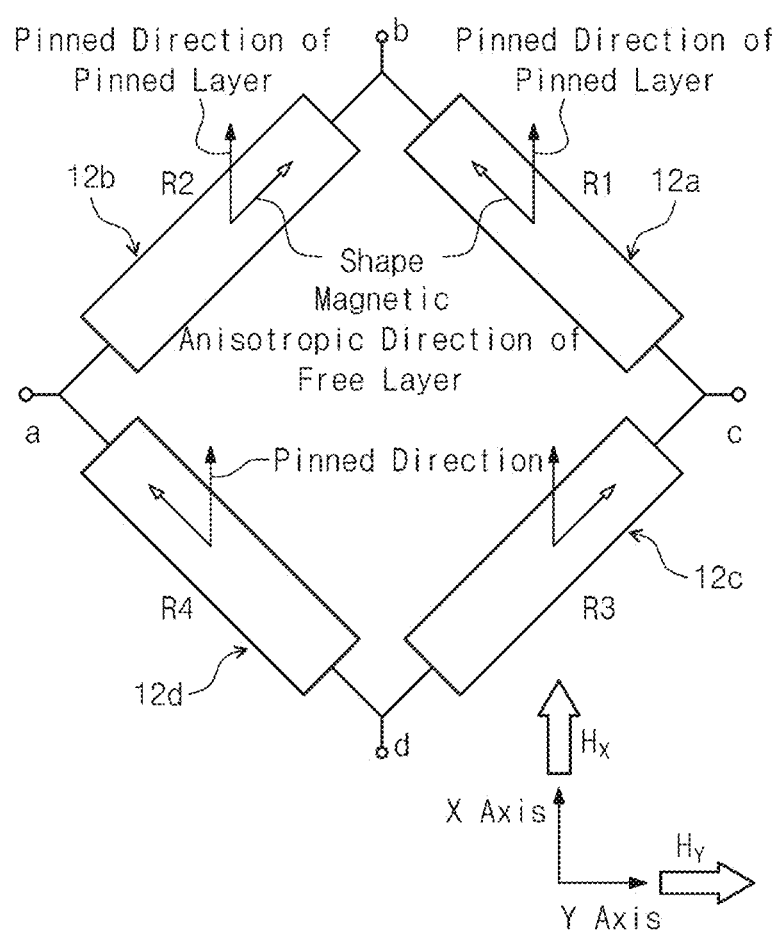
FIG. 1 is a conceptual diagram of a Wheatstone bridge GMR magnetic sensor according to an example embodiment of the present disclosure.

FIG. 1 is a conceptual diagram of a Wheatstone bridge GMR magnetic sensor according to an example embodiment of the present disclosure.

Figure 2:
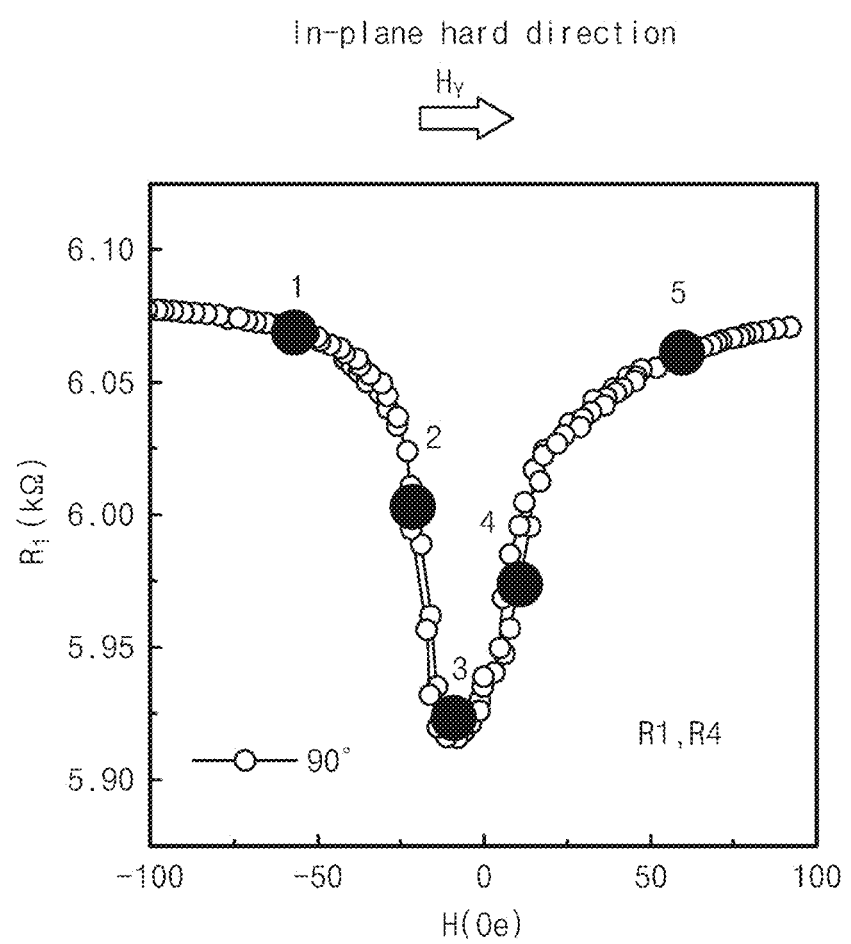
FIG. 2 illustrates resistance depending on an external magnetic field along a magnetic hard axis direction in a first GMR resistor in FIG. 1.

FIG. 2 illustrates resistance depending on an external magnetic field along a magnetic hard axis direction in a first GMR resistor in FIG. 1.

Figure 3:
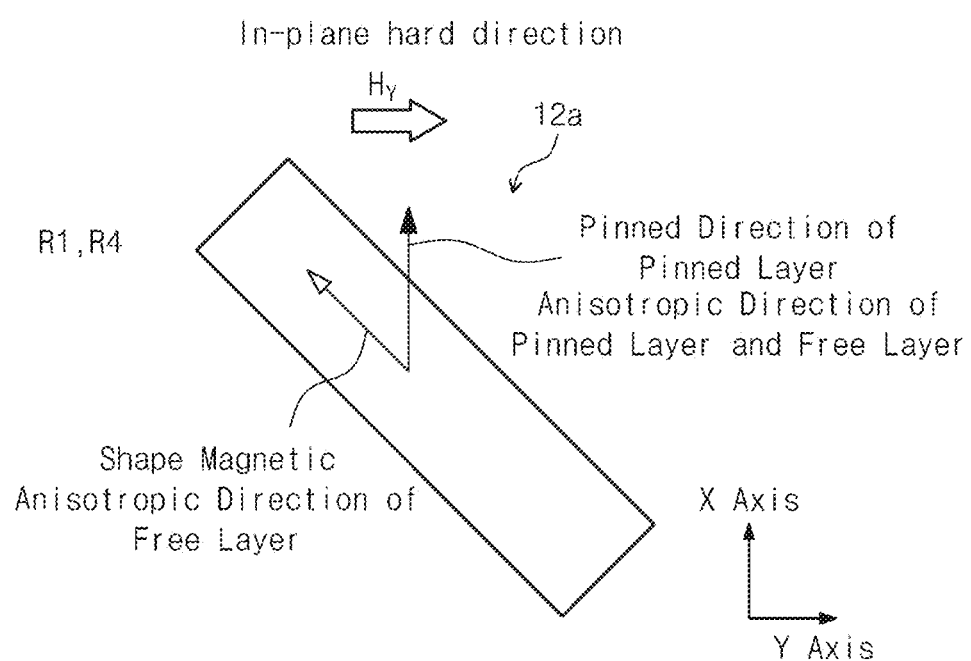
FIG. 3 illustrates a magnetization direction of a pinned layer and a shape magnetic anisotropy direction of a free layer of the first GMR resistor in FIG. 1.

FIG. 3 illustrates a magnetization direction of a pinned layer and a shape magnetic anisotropy direction of a free layer of the first GMR resistor in FIG. 1.

Figure 4:
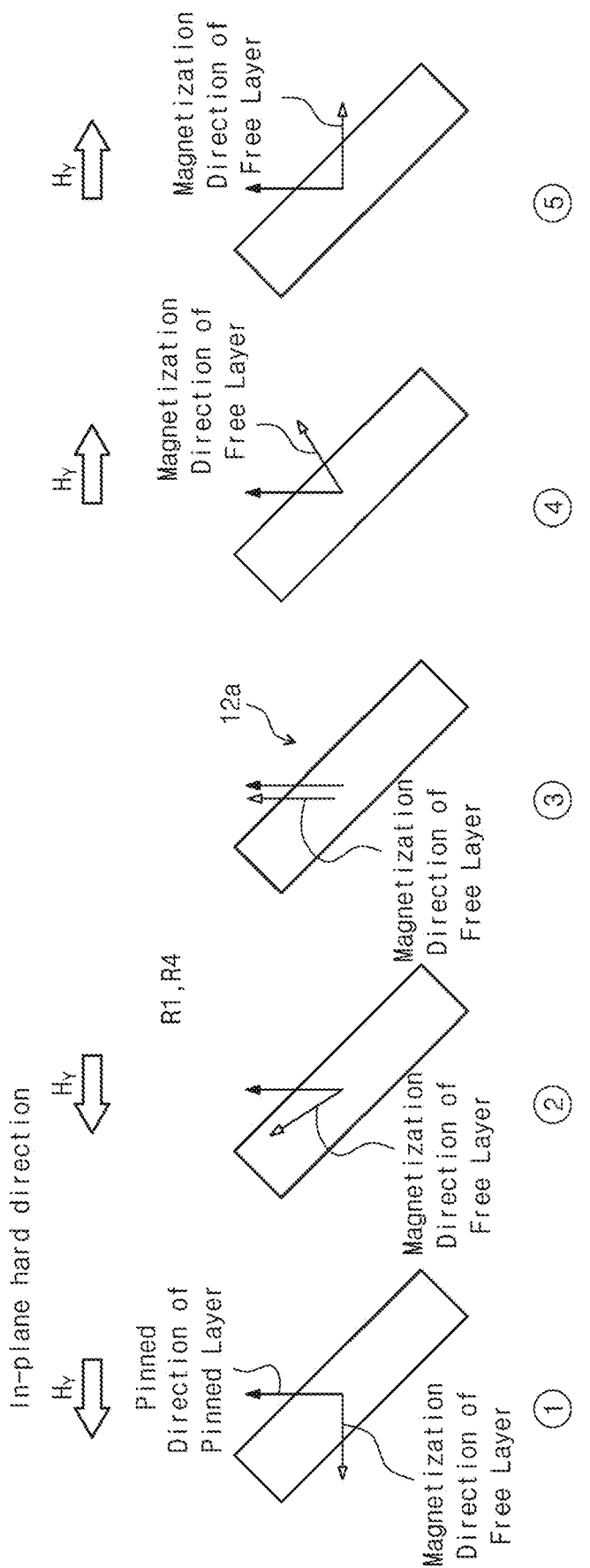
FIG. 4 illustrates a magnetization direction of a free layer depending on an external direction along a magnetic hard axis direction in the first GMR resistor in FIG. 1.

FIG. 4 illustrates a magnetization direction of a free layer depending on an external direction along a magnetic hard axis direction in the first GMR resistor in FIG. 1.

Figure 5:
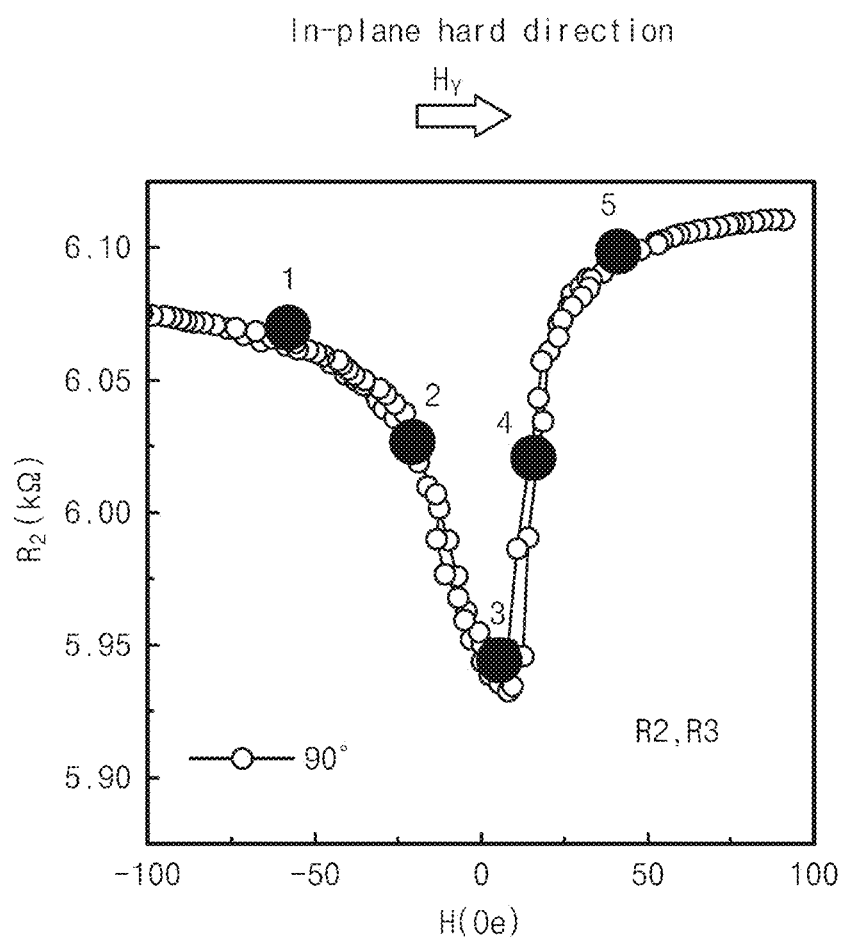
FIG. 5 illustrates resistance depending on an external magnetic field along a magnetic hard axis direction in a second GMR resistor in FIG. 1.

FIG. 5 illustrates resistance depending on an external magnetic field along a magnetic hard axis direction in a second GMR resistor in FIG. 1.

Figure 6:
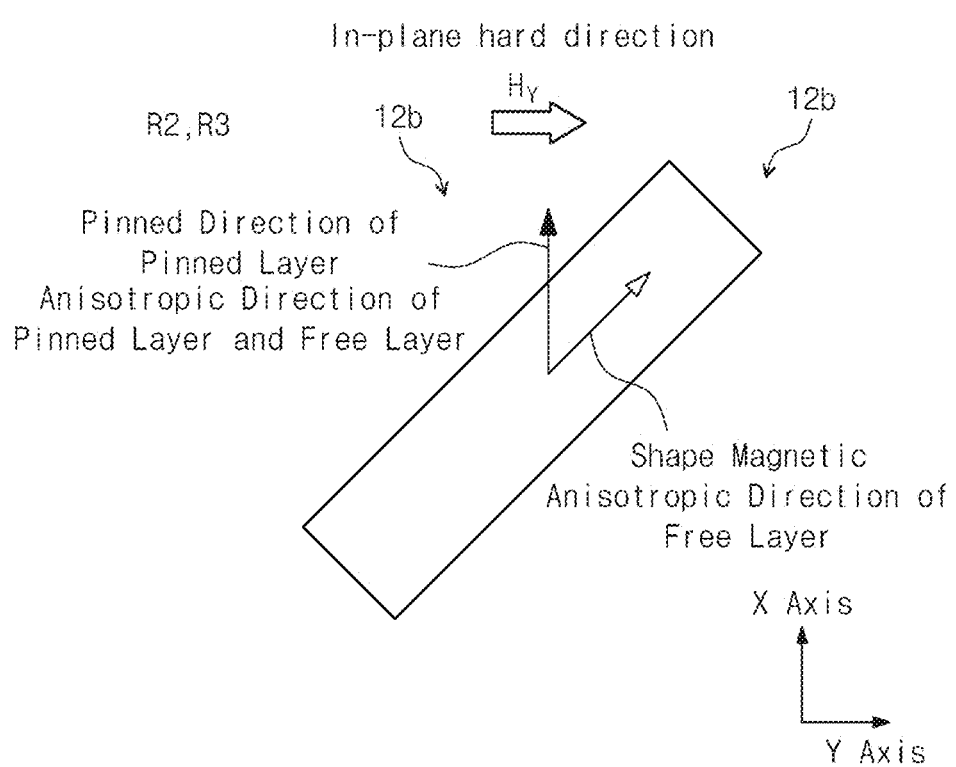
FIG. 6 illustrates a magnetization direction of a pinned layer and a shape magnetic anisotropy direction of a free layer of the second GMR resistor in FIG. 1.

FIG. 6 illustrates a magnetization direction of a pinned layer and a shape magnetic anisotropy direction of a free layer of the second GMR resistor in FIG. 1.

Figure 7:
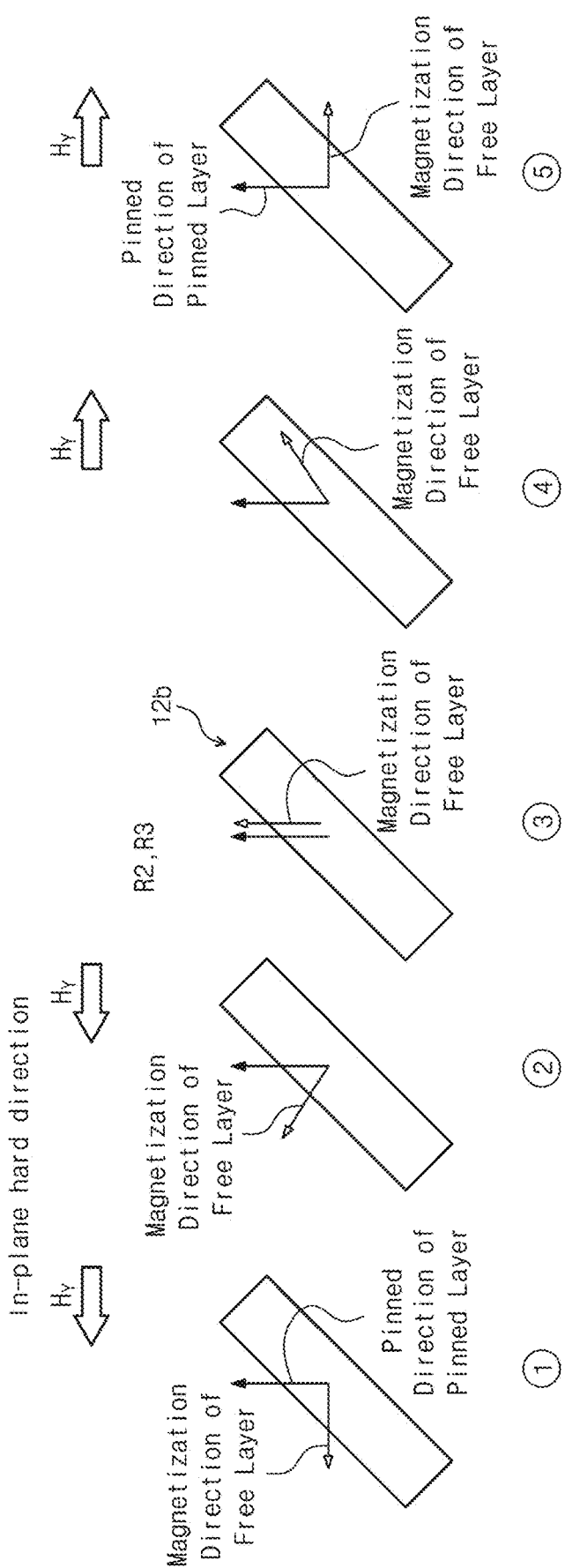
FIG. 7 illustrates a magnetization direction of a free layer depending on an external magnetic field direction along a magnetic hard axis direction in the second GMR resistor in FIG. 1.
Figure 8A:
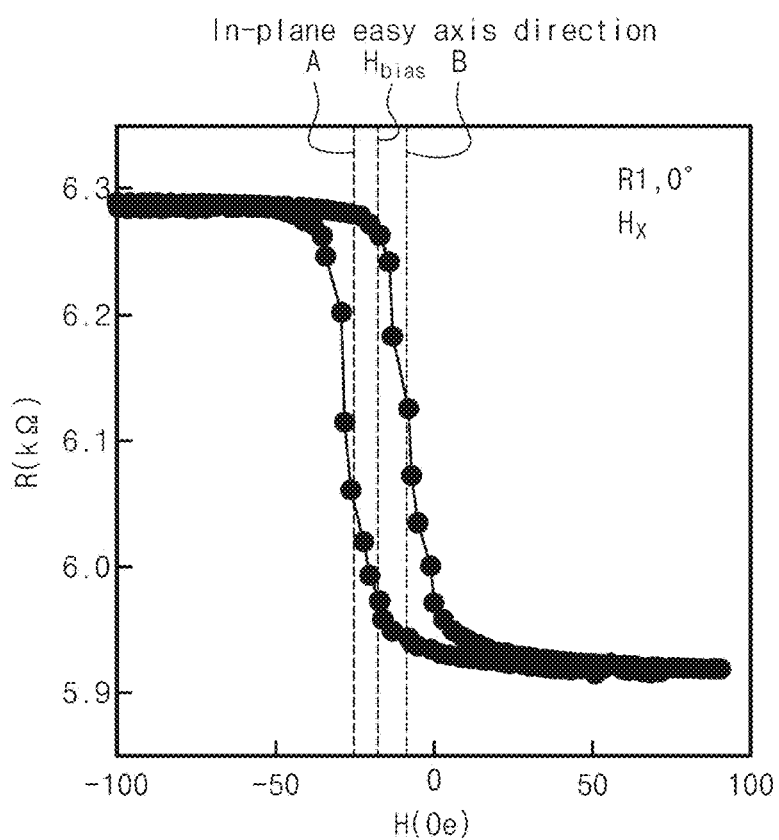
FIGS. 8A to 8D illustrate resistance depending on an external magnetic field along a magnetic easy axis direction from first to fourth GMR resistors in FIG. 1.
Figure 8B:
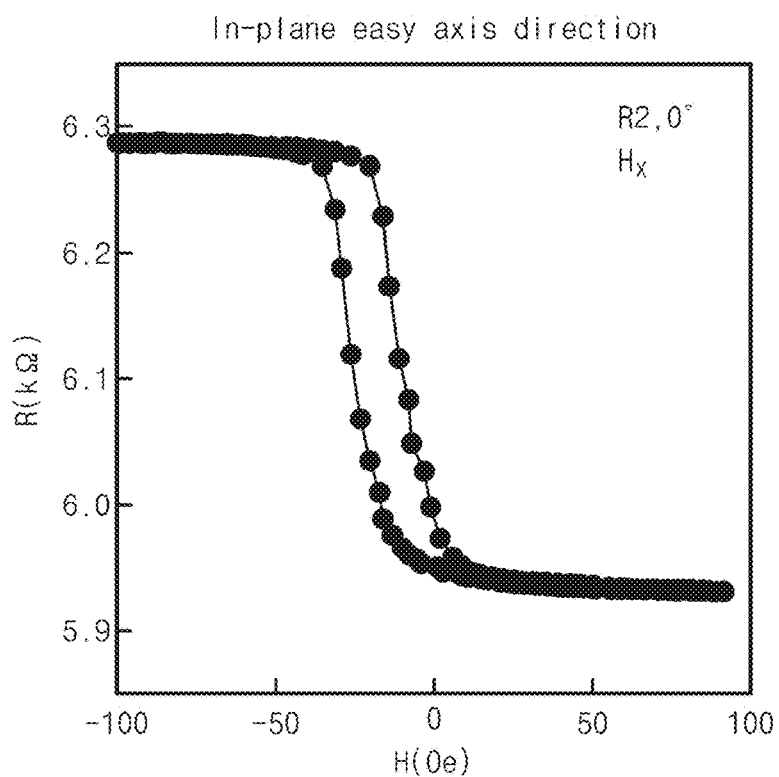
Figure 8C:
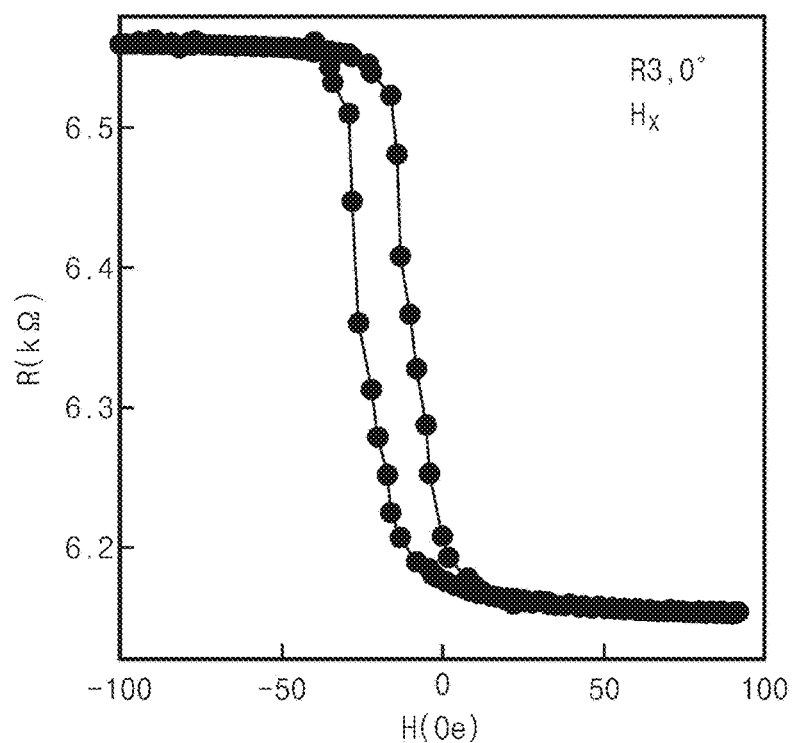
Figure 8D:
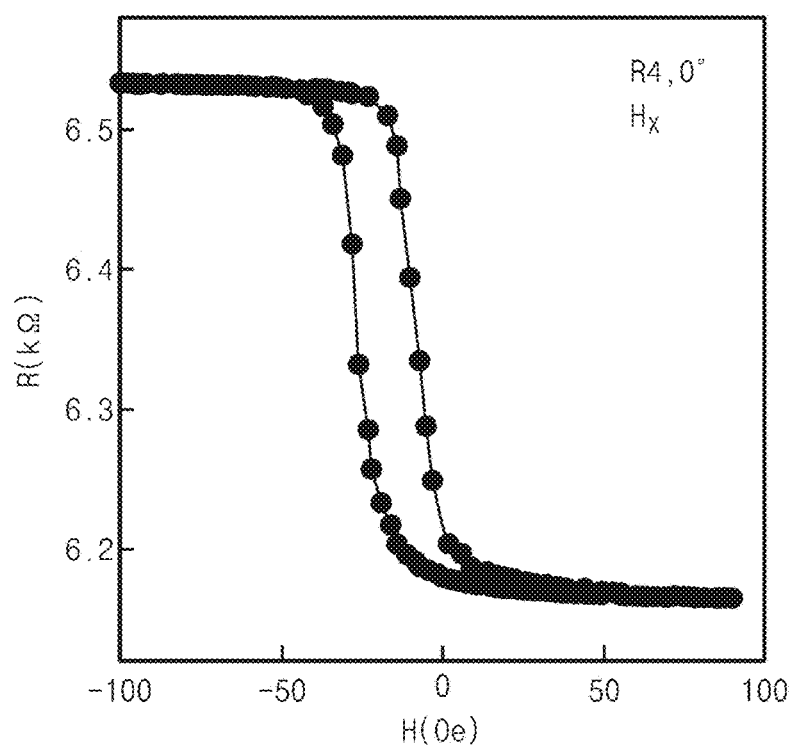
Figure 9A:
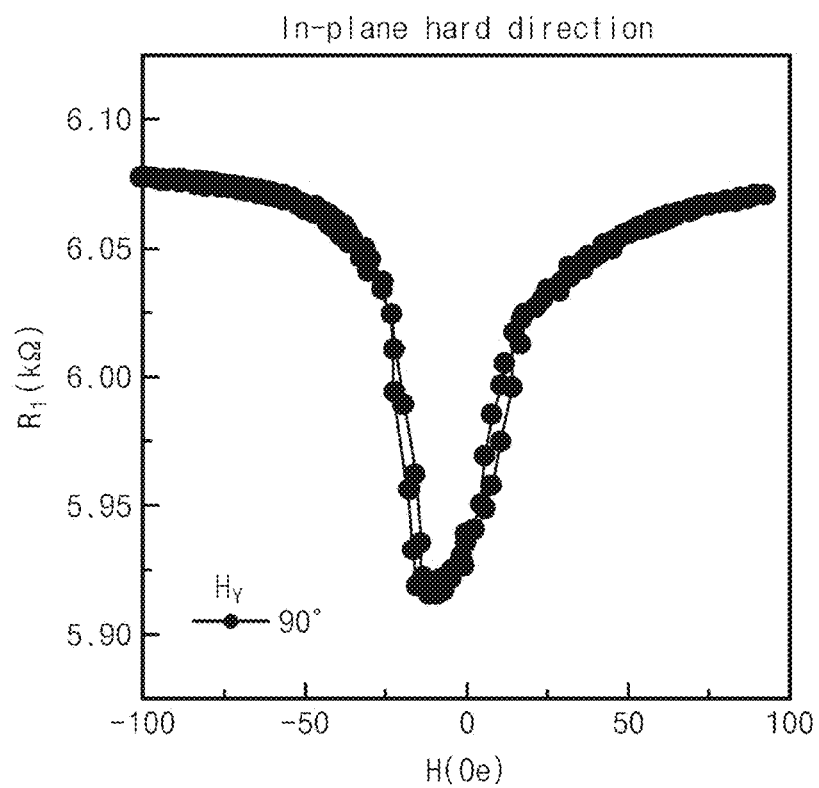
FIGS. 9A to 9D illustrate resistance depending on an external magnetic field along a magnetic hard axis direction from first to fourth GMR resistors in FIG. 1.
Figure 9B:
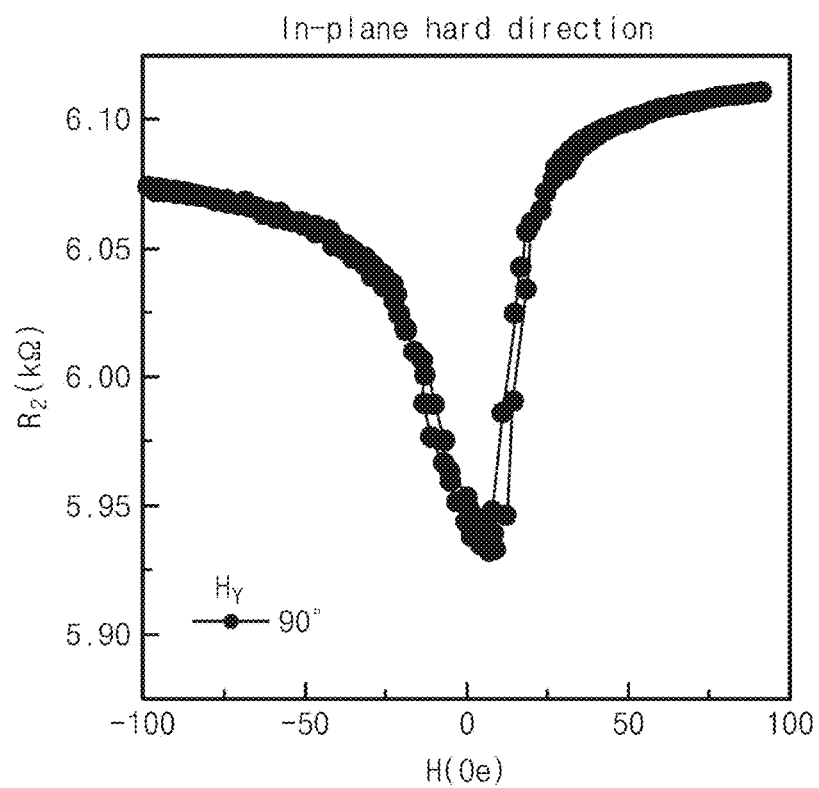
Figure 9C:
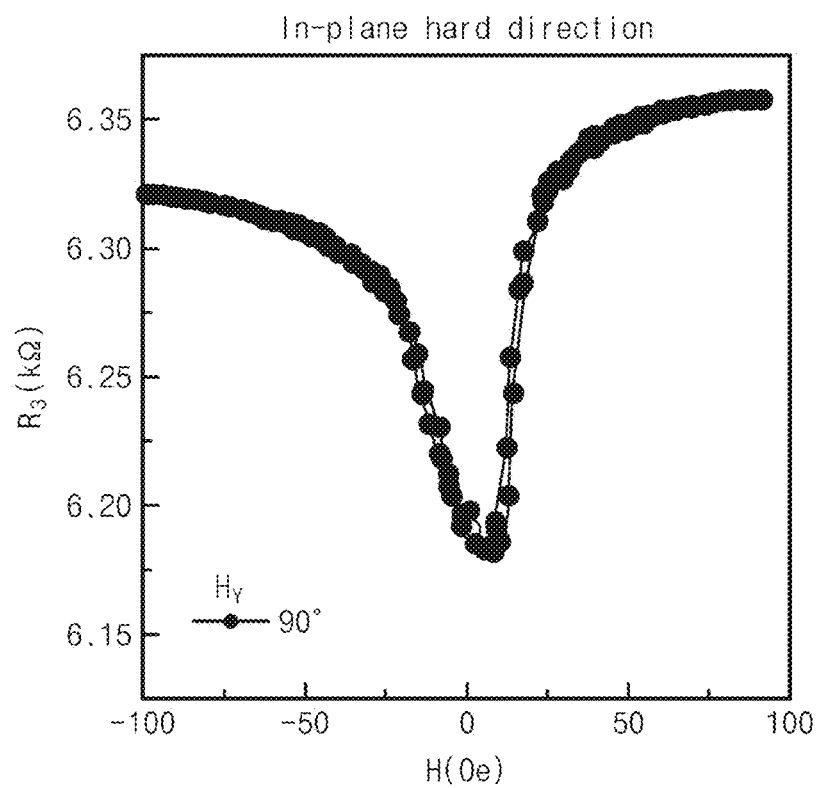
Figure 9D:
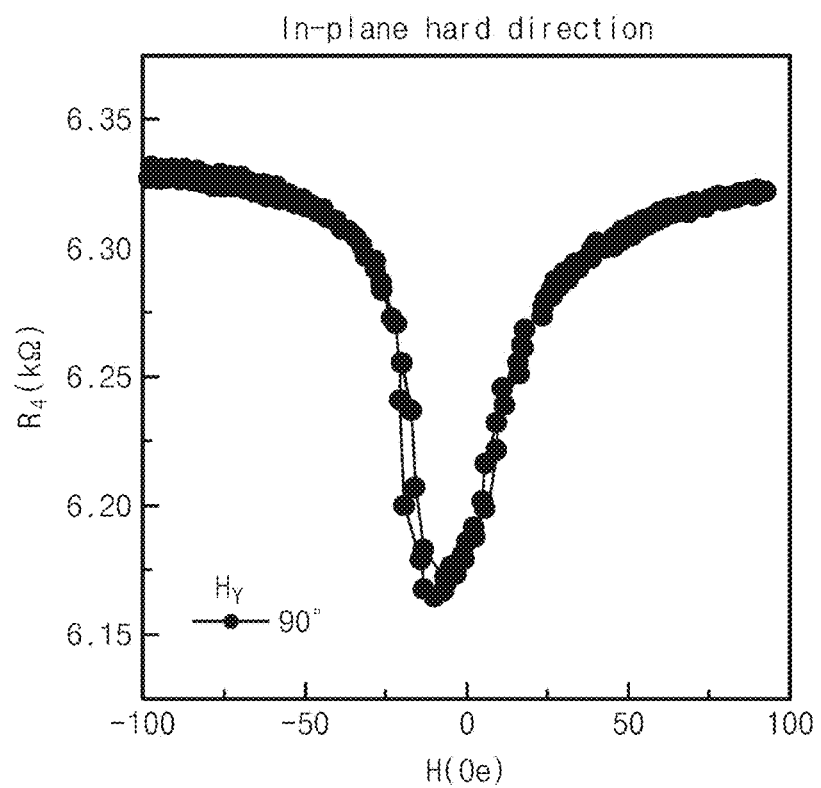

FIG. 7 illustrates a magnetization direction of a free layer depending on an external magnetic field direction along a magnetic hard axis direction in the second GMR resistor in FIG. 1.

FIGS. 8A to 8D illustrate resistance depending on an external magnetic field along a magnetic easy axis direction from first to fourth GMR resistors in FIG. 1.

FIGS. 9A to 9D illustrate resistance depending on an external magnetic field along a magnetic hard axis direction from first to fourth GMR resistors in FIG. 1.

Figure 10A:
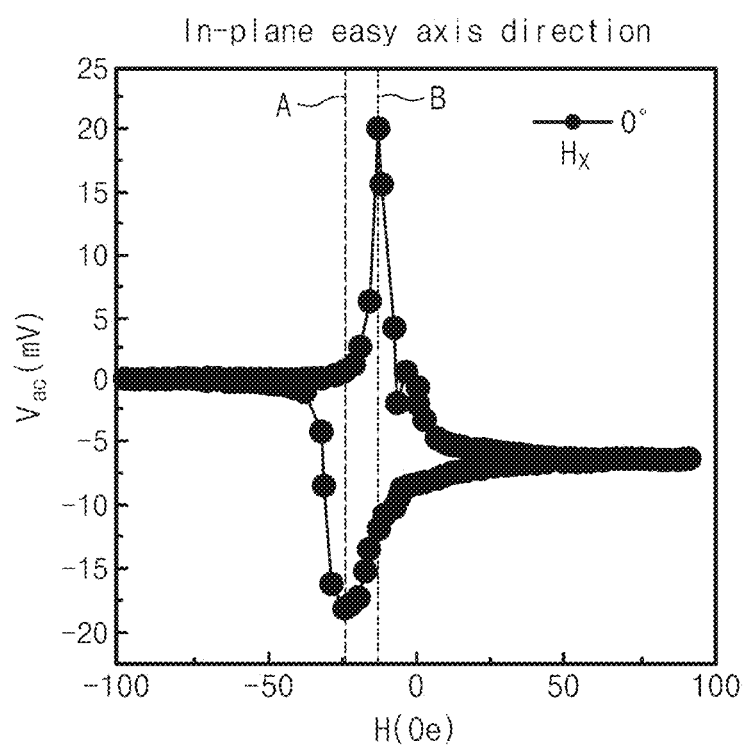
FIGS. 10A and 10B illustrate a voltage between a first terminal "a" and a third terminal "c" depending on external magnetic fields Hx and Hy in a magnetic easy axis direction in the Wheatstone bridge magnetic sensor in FIG. 1.
Figure 10B:
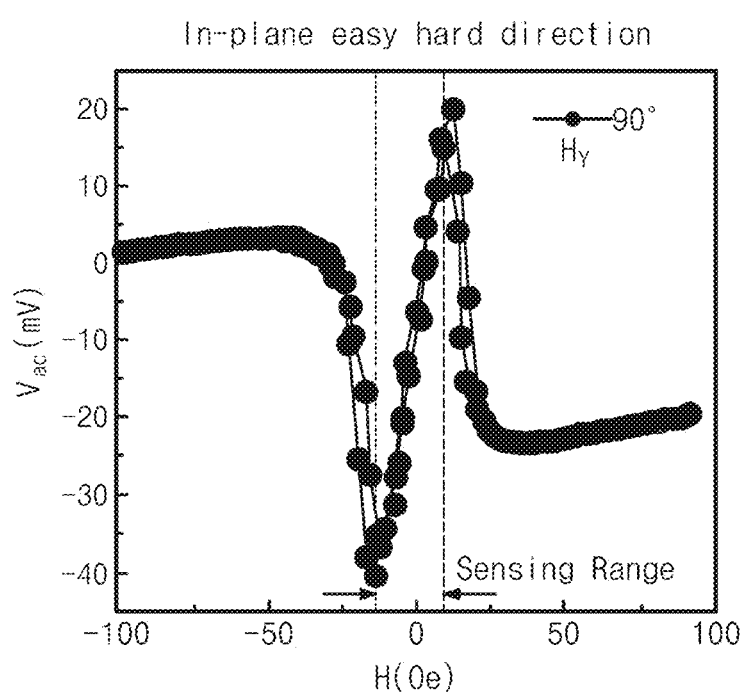

FIGS. 10A and 10B illustrate a voltage between a first terminal "a" and a third terminal "c" depending on external magnetic fields Hx and Hy in a magnetic easy axis direction in the Wheatstone bridge magnetic sensor in FIG. 1.

Referring to FIGS. 1 to 7, FIGS. 8A to 8D, FIGS. 9A to 9D, and FIGS. 10A and 10B, a Wheatstone bridge magnetic sensor 10 includes first to fourth GMR resistors 12a to 12d. The Wheatstone bridge magnetic sensor 10 includes first to fourth terminals a, b, c, and, a voltage between the first terminal "a" and the third terminal "c" indicates an output voltage. The second terminal "b" may be connected to an external DC voltage, and the fourth terminal "d" may be grounded. The first GMR resistor 12a and the fourth GMR resistor 12d may be located side by side to be separated from each other. The second GMR resistor 12b and the third GMR resistor 12c may rotate about the first GMR resistor 12a and may be located side by side to be separated from each other.

Each of the GMR resistors 12a to 12d may extend in a length direction and return after being spaced therefrom, for example, may have a meander shape to have shape magnetic anisotropy. A shape magnetic anisotropy direction of a GMR resistor may be an extending direction of the GMR resistor. A magnetization direction of a pinned layer may be the same for all GMR resistors and may be an x-axis direction rotated at an angle of 45 degrees in the extending direction. All GMR resistors may have in-plane magnetic anisotropy.

A magnetization direction of a pinned layer may match a magnetic easy axis of a free layer. An external magnetic field may include a magnetic easy axis magnetic field, applied along a magnetic easy axis direction (x-axis direction), and a magnetic hard axis magnetic field applied along a magnetic hard axis direction (y-axis direction).

The magnetic device includes a seed layer (Ta (5.0 nm)), a free layer (Ta (5.0 nm)), a metal spacer layer (Cu (2.2 nm)) and a pinned layer (Co90Fe10), an antiferromagnetic layer (Ir21Mn79 (6.0 nm)), and a capping layer (Ta (5.0 nm)).

Referring to FIGS. 2, 3 and 4, when an external magnetic field Hy is applied to the first GMR resistor 12a along a magnetic hard axis (y-axis) direction, a free layer may be aligned along an external magnetic field direction in the case in which the external magnetic field Hy is a sufficient high intensity. Meanwhile, the free layer may rotate along a shape magnetic anisotropy direction (extension direction) when the external magnetic field Hy is a low intensity. Further, when the external magnetic field Hy is removed, the free layer may be aligned along the shape magnetic anisotropy direction.

Referring to FIGS. 5, 6 and 7, when an external magnetic field Hy is applied to the second GMR resistor 12b in a magnetic hard axis (y-axis) direction, a free layer may be aligned in an external magnetic field direction in the case in which the external magnetic field Hy has a sufficiently high intensity. Meanwhile, the free layer may rotate in a shape magnetic anisotropy direction in the case in which the external magnetic field Hy has a low intensity. Further, when the external magnetic field Hy is removed, the free layer may be aligned along the shape magnetic anisotropy direction.

Referring to FIGS. 8A to 8D, a value of the first GMR resistor 12a indicates a hysteresis depending on an intensity and a sign of an external magnetic field Hx along a magnetic easy axis (x-axis) direction. The intensity of the external magnetic field having a sharp slope in the hysteresis may be a point A and a point B. Further, an intermediate value between the point A and the point B may be a bias magnetic field $H_{bias}$. The point A may be about 25 Oe, the point B may about 10 Oe, and the bias magnetic field $H_{bias}$ may be about 17 Oe.

Referring to FIGS. 9A to 9D, a value of the first GMR resistor 12a has a single value depending on an intensity and a sign of an external magnetic field Hy along a magnetic hard axis (y-axis) Hy) direction and may have a minimum value when the external magnetic field Hy is close to zero.

Referring to FIGS. 10A and 10B, a voltage Vac between a first terminal "a" and a third terminal "c" depending on an external magnetic field Hx of an magnetic easy axis direction in a Wheatstone bridge magnetic sensor 10 indicates a negative maximum value at a point A (about 25 Oe) and a positive maximum at point B (about 10 Oe). The earth magnetic field is 1 Oe or less, and a sensing range for measuring the earth magnetic field may be a positive Oe to a negative Oe.

However, within the sensing range from a positive Oe to a negative Oe, the voltage Vac between the first terminal "a" and the third terminal "c" depending on the external magnetic field Hx in a magnetic easy axis direction may have a value depending on a peak or the external magnetic field Hx. A voltage signal Vac, generated by the external magnetic field Hx along the magnetic easy axis direction, may cause distortion of a signal along the magnetic hard direction to be measured.

Accordingly, in a GMR resistor, points A and B, where a resistance hysteresis depending on the external magnetic field Hx in the magnetic easy axis direction has a maximum slope, should be designed to deviate from the sensing range. A bias magnetic field $H_{bias}$, an intermediate value of the points A and B, may have, in detail, a zero value. The voltage Vac between the first terminal "a" and the third terminal "c" depending on the external magnetic field Hx along the magnetic easy axis direction needs to have a value of zero or a constant value within the sensing range.

According to an example embodiment, a GMR resistance element structure, capable of adjusting a bias magnetic field $H_{bias}$, is proposed. In the magnetoresistance element according to an example embodiment, the points A and B are located outside of the sensing range (for example, a negative Oe to a positive Oe).

According to an example embodiment, a sensitivity value along the magnetic hard axis direction may increase.

Figure 11A:
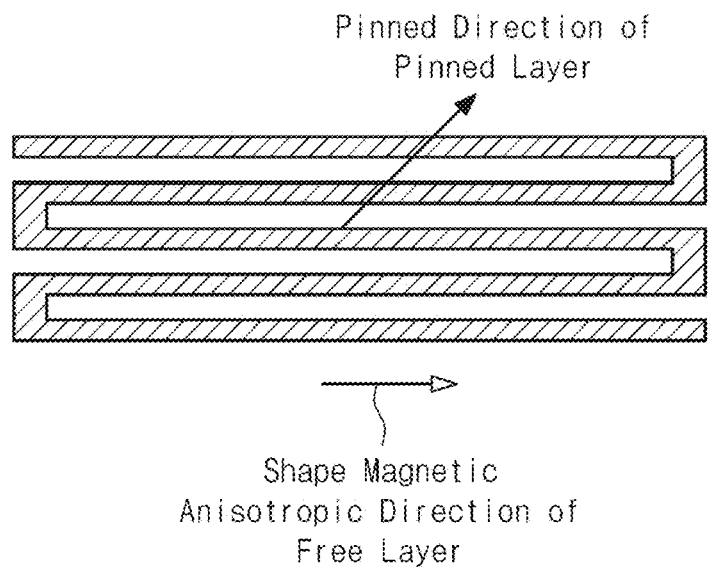
FIG. 11A is a plan view of a GMR element according to an example embodiment of the present disclosure.

FIG. 11A is a plan view of a GMR element according to an example embodiment of the present disclosure.

Figure 11B:
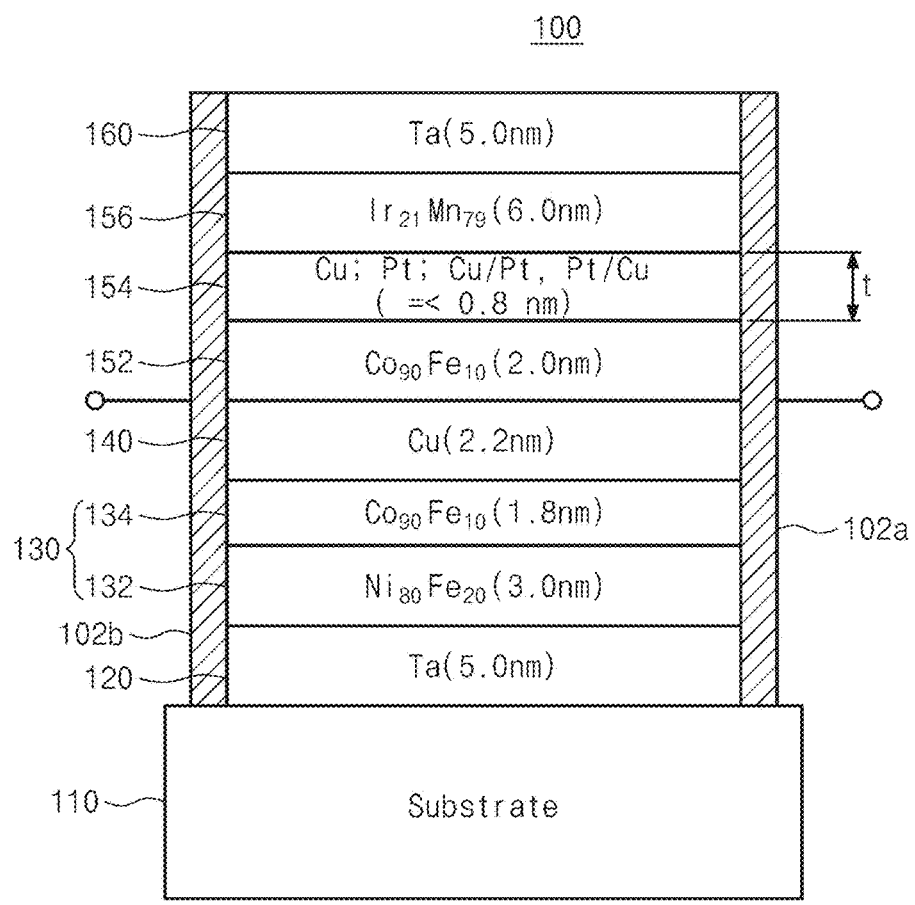
FIG. 11B is a cross-sectional view of a GMR element according to an example embodiment of the present disclosure.

FIG. 11B is a cross-sectional view of a GMR element according to an example embodiment of the present disclosure.

Referring to FIGS. 11A and 11B, a magnetic device 100 may be a GMR element. The magnetic device 100 includes a pinned layer 152 having an in-plane magnetization direction, a free layer 130, having an in-plane magnetization direction, vertically spaced apart from the pinned layer 152 to be aligned with the pinned layer 152, a conductive spacer layer 140 disposed between the pinned layer 152 and the free layer 130, an antiferromagnetic layer 156 disposed to fix the magnetization direction of the pinned layer 152 and vertically spaced apart from the pinned layer 152 to be aligned with the pinned layer 152, and a noble metal spacer layer 154 disposed between the pinned layer 152 and the antiferromagnetic layer 154. The noble metal spacer layer 154 may be a single-layer thin film of copper or platinum, or a multilayer thin film of copper and platinum, and may have a thickness of 0.1 to 0.8 nanometer (nm). The magnetic device 100 may be connected with a Wheatstone bridge structure to constitute a magnetic sensor.

The magnetic device 100 may have a winding structure formed on a substrate 110 by repeatedly extending a positive first direction, then extending in a second direction, and then extending in a negative first direction. Opposite ends of the magnetic device 100 may be connected to an electrode pad through electrodes 102a and 102b.

The magnetization direction of the pinned layer 152 of the magnetic device 100 may rotate 45 degrees in a first direction, an extending direction of the magnetic device 100, to be disposed in a plane. The magnetization direction of the pinned layer 152 of the magnetic device 100 may be a magnetic easy axis direction. A magnetic easy axis of the free layer 130 of the magnetic device 100 may be the same as a magnetic easy axis of the pinned layer 152. A shape anisotropy direction of the magnetic device 100 may be the first direction. Accordingly, when an external magnetic field is not applied, the free layer 130 may be aligned along the shape anisotropy direction (the first direction).

The substrate 110 may be a silicon substrate or a semiconductor substrate. The substrate 110 may include an insulating layer such as a silicon oxide layer. More specifically, the substrate 100 may be a substrate obtained by oxidizing a P-type silicon substrate in a hydration manner.

A seed layer 120 is disposed on the substrate 110. The seed layer 120 may be tantalum (Ta). The seed layer 120 may have a thickness of 5.0 nm. The seed layer 120 may provide a smooth surface to a giant magnetoresistance (GMR) thin film of a spin valve structure.

The free layer 130 may be disposed on the seed layer 120. The free layer 130 may include a first ferromagnetic layer 132 and a second ferromagnetic layer 134 sequentially stacked. The first ferromagnetic layer 132 may be $Ni_{80}Fe_{20}$. The first ferromagnetic layer 132 may have a thickness of 3.0 nm. The second ferromagnetic layer 134 may be $Co_{90}Fe_{10}$. The second ferromagnetic layer 134 may have a thickness of 1.8 nm. The free layer 130 may relatively freely provide magnetization conversion to an applied magnetic field. The free layer 130 may include Co, Ni, Fe, or alloys thereof, and may have a single-layer or multilayer structure. More specifically, the free layer 130 may include NiFe, CoFe, or CoFeB. The free layer 130 may have in-plane magnetic anisotropy, and a magnitude of the in-plane magnetic anisotropy may be adjusted controlled depending on the thickness of the free layer 130, and a crystal structure and a plan direction in which atoms are accumulated during deposition.

The conductive spacer layer 140 may be disposed on the free layer 130. The conductive spacer layer 140 may be copper. The conductive spacer layer 140 may have a thickness of 2.0 nm. The conductive spacer layer 140 may contribute to a GMR effect through spin-dependent scattering.

The conductive spacer layer 140 may be converted into a tunnel barrier layer, having insulation characteristics such as MgO, AlOx, GdOx, or the like, required for tunnel magnetoresistance similar to the GMR effect.

The pinned layer 152 may be disposed on the conductive spacer layer 140. The pinned layer 152 may be $Co_{90}Fe_{10}$. The pinned layer may have a thickness of 2.0 nm. The pinned layer 152 may include Co, Ni, Fe, or alloys thereof, and may have a single-layer or multilayer structure. More specifically, the pinned layer 152 may include NiFe, CoFe, or CoFeB. The pinned layer 152 may have in-plane magnetic anisotropy, and a magnitude of the in-plane magnetic anisotropy may be adjusted depending on the thickness of the fixed layer 152, and a crystal structure and a plan direction in which atoms are accumulated during deposition.

The noble metal spacer layer 154 may be disposed on the pinned layer 152.

The noble metal spacer layer 154 may be Pd, Ag, Au, Ru, Cu, or Pt. The noble metal spacer layer 154 may be a single-layer thin film of copper or platinum, or a multilayer thin film of copper and platinum, and may have a thickness t of 0.1 to 0.8 nm. When the noble metal spacer layer 154 has a thickness greater than 0.8 nm, an interaction between the antiferromagnetic layer 156 and the pinned layer 152 may be reduced, and thus, the magnetization direction of the pinned layer 152 may not be pinned. The noble metal spacer layer 154 may increase density of a Néel domain wall in the pinned layer 152 between the pinned layer 152 and the antiferromagnetic layer 156. The noble metal spacer layer 154 may reduce the bias magnetic field $H_{bias}$ depending on the external magnetic field along the magnetic easy axis direction. Thus, signal distortion of a Wheatstone bridge circuit, caused by the external magnetic field along the magnetic easy axis direction, may be reduced. In addition, the noble metal spacer layer 154 may increase sensitivity of the magnetic signal depending on the external magnetic field along the magnetic hard axis direction.

The antiferromagnetic layer 156 may be disposed on the noble metal spacer layer 154. The antiferromagnetic layer 156 may be $Ir_{21}Mn_{79}$. The antiferromagnetic layer 156 may have a thickness of 6.0 nm. The antiferromagnetic layer 156 may pin the magnetization direction of the pinned layer 154 along a direction of an exchange bias magnetic field.

The capping layer 160 may be disposed on the antiferromagnetic layer 156. The capping layer 160 may be tantalum (Ta). The capping layer 160 may have a thickness of 5.0 nm. The capping layer 160 prevents oxidation of a GMR thin film of the spin valve structure.

Respective layers, stacked on the magnetic device 100, may be deposited by means of DC magnetron sputtering deposition. The degree of vacuum inside a chamber, in which a plurality of sputtering targets are mounted, is about $7 \times 10^{-8}$ Torr. The deposition may be performed in an atmosphere of $2 \times 10^{-3}$ Torr by injection of an argon (Ar) gas. All layers are successively deposited in a vacuum state. The sputtering targets may be Ta, $Ni_{80}Fe_{20}$, $Co_{90}Fe_{10}$, Cu, Pt, and $Ir_{21}Mn_{79}$. A permanent magnet, including iron oxide, is disposed around a substrate holder, on which a thin film is deposited, to induce magnetic anisotropy of the free layer 130 and the pinned layer 152 during the deposition process. The permanent magnet applies a uniform magnetic field of 80 Oe to the free layer 130 or the pinned layer 152 in a single direction.

After the deposition of the capping layer 160 is completed, the substrate 110 is transferred to a new chamber. The new chamber has the degree of vacuum of $1 \times 10^{-6}$ Torr, and a post-annealing process is performed at a temperature of 250° C. for 10 minutes under a uniform magnetic field of 2 kOe in the same direction as the direction in which magnetic anisotropy is formed. Accordingly, the post-annealing process may generate an exchange bias magnetic field of the pinned layer 152 and may stabilize a stress generated between thin films during a deposition process.

Characteristics, such as the exchange bias magnetic field and the magnetic anisotropy of the pinned layer 152 and a bias magnetic field and the magnetic anisotropy of the free layer 130, may be adjusted through the magnitude of a magnetic field, applied during deposition of the free layer 130 and the pinned layer 152, and a temperature and the magnetic of a magnetic field applied during the post-annealing process.

Magnetic characteristics of the GMR thin film were measured using a vibrating sample magnetometer. In addition, magnetoresistance characteristics were measured using a four-probe method. Magnetic domain wall behaviors in the free layer 130 and the pinned layer 152 were observed using a magneto-optical Kerr effect (MOKE) microscope.

By adjusting the thicknesses of the free layer 130, the antiferromagnetic layer 156, and the metal spacer layer 154, interface roughness during deposition, a crystal structure and a plane direction in which atoms are accumulated, and width and density of a Néel domain wall, and the like, a magnetostatic interaction, caused by the domain wall, may be controlled to adjust the magnitude of the bias magnetic field $H_{bias}$ of the free layer 130.

A thickness and a material of the noble metal spacer layer 154, inserted between the antiferromagnetic layer 156 and the pinned layer 152, may control the width and density of the Néel domain wall of the antiferromagnetic layer 156. The noble metal spacer layer 152 may control the magnetostatic interaction, caused by the magnetic domain wall, and control the magnitude of the bias magnetic field $H_{bias}$ of the free layer 130.

According to a modified embodiment, the noble metal spacer layer 152 may be similarly applied to a tunnel magnetoresistance effect using a tunnel barrier layer.

A sensitivity value along the magnetic hard axis direction is expected to be affected in a spin valve structure by various parameters such as (1) a value of magnetic anisotropy or an exchange bias magnetic field of the pinned layer 152, (2) a value of magnetic anisotropy or an interlayer exchange coupling field of the free layer 130, and the like. The sensitivity value along the magnetic hard axis direction may be most affected by the value of the interlayer exchange coupling field of the free layer 130.

In a spin valve structure according to an example embodiment, a value of an interlayer exchange coupling field of the free layer 130 may depend on Ruderman-Kittel-Kasuya-Yosida (RKKY) type exchange coupling, Néel orange peel coupling, or an influence of a stray field of the pinned layer 152. The interlayer exchange coupling field indicates the degree in which a magnetic hysteresis curve, appearing when an external magnetic field is applied along a magnetic easy axis direction of the free layer 130, deviates from the origin. The interlayer exchange coupling field may be expressed as a bias magnetic field $H_{bias}$ of the free layer 130.

According to an example embodiment, a layer, expected to have a greatest effect on interlayer exchange coupling of the free layer 130 in the spin valve structure, is the metal spacer layer 140 inserted between the free layer 130 and the pinned layer 152.

The metal spacer layer 140 is formed of copper (Cu). When the thickness of the metal spacer layer 140 reached about 2.2 nm, pinhole coupling, caused by strong ferromagnetic coupling, does not appear. In addition, the metal spacer layer 140 has a thickness at which second highest antiferromagnetic coupling emerges in terms of Ruderman-Kittel-Kasuya-Yosida (RKKY) type exchange coupling, such that ferromagnetic coupling is canceled for a bias magnetic field of the free layer to decrease a value thereof. However, a value of am interlayer exchange coupling constant of the metal spacer layer 140 small, and an affect of antiferromagnetic coupling when the metal spacer layer 140 has a thickness of 2.2 nm is significantly lower than an affect of ferromagnetic coupling caused by Néel orange peel coupling. As a result, the bias magnetic field of the free layer 130 deviates much from the origin and has a value which favors the ferromagnetic coupling.

As an extrinsic component acting outside of the bias magnetic field of the free layer 130, there is an effect of a magnetostatic interaction effect caused by a domain wall. The magnetostatic interaction forms flux-closure due to an interaction between Néel domain walls present in the free layer 130 and the pinned layer 152. The magnetostatic interaction serves as a fixture in a magnetization reversal process of the free layer 130 to interfere with the magnetization reversal process. The intensity of the magnetostatic interaction may be adjusted by sizes of the Néel domain walls present in the free layer 130 and the pinned layer 152, mutual relative sizes thereof, amount or density of the magnetic domain wall, and the like.

If the magnitude of the bias magnetic field of the free layer 130 is reduced, sensitivity characteristic along the magnetic hard direction may be improved and noise, caused by the magnetic easy axis, may be inhibited when used as a GMR sensor.

The bias magnetic field $H_{bias}$ of the free layer 130 may be adjusted using an effect of domain wall induced magnetostatic interaction. This effect may be controlled by adjusting type and thickness of the free layer 130 or the fixed layer 152 on the spin valve structure, thickness of the metal spacer layer 140, type and thickness of the noble metal spacer layer 154, and the like.

Three factors such as RKKY type exchange coupling, Néel orange peel coupling, and a stray magnetic field of a pinned layer, conventionally affecting the bias magnetic field $H_{bias}$ of the free layer 130, are limited in reducing the magnetic field $H_{bias}$ of the free layer 130. However, use of a magnetostatic interaction, resulting from a domain wall, may cause the bias magnetic field $H_{bias}$ of the free layer 130 to be more effectively reduced.

The bias magnetic field $H_{bias}$ of the free layer 130 may be controlled by adjusting the magnitude of a magnetization reversal magnetic field of the free layer 130 which determines both the bias magnetic field $H_{bias}$ and coercive force of the free layer 130. Magnetization reversal of the free layer 130 may be classified into two cases. First, magnetization reversal of the free layer 130 occurs such that states of the free layer 130 and the pinned layer 152 change from an antiparallel state to a parallel state. Second, magnetization reversal of the free layer 130 occurs such that states of the free layer 130 and the pinned layer 152 change from change from a parallel state to an antiparallel state.

When using a magnetostatic interaction resulting from a domain wall, the magnitude of a magnetic field, in which magnetization reversal from a parallel state to an antiparallel state occurs, is almost unchanged, whereas the magnitude of a magnetic field, in which magnetization reversal from an antiparallel state to a parallel state occurs, may be changed. Accordingly, when the magnitude of the magnetic field, generated from a parallel state from an antiparallel state during magnetization reversal of the free layer, is increased, the magnitude of the bias magnetic field of the free layer may be reduced.

FIG. 12A to 12D illustrate magnetization characteristics depending on an external magnetic field along a magnetic easy axis direction for a material and a thickness of a noble metal spacer layer in a magnetic device according to an example embodiment of the present disclosure.

Figure 12A:
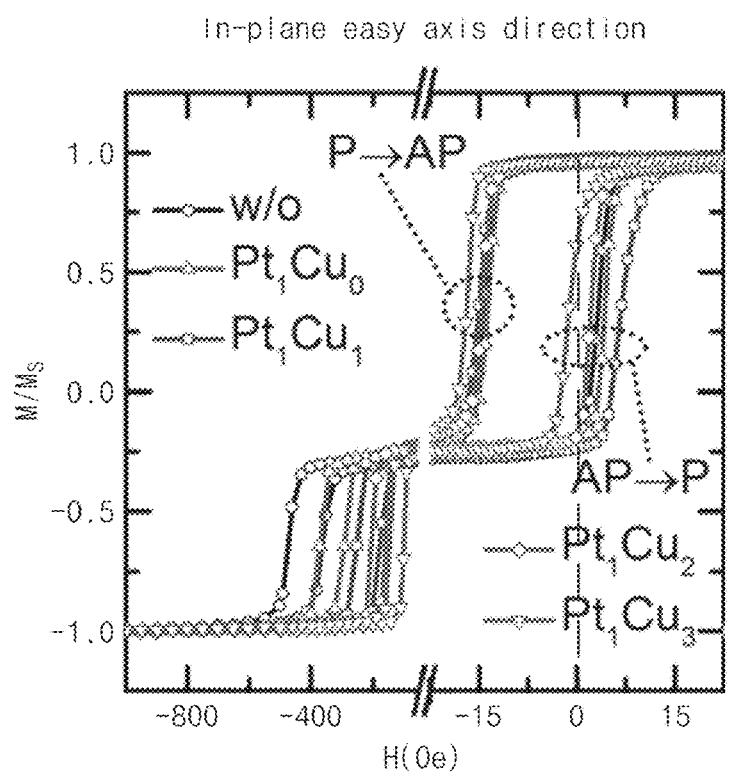
FIG. 12A to 12D illustrate magnetization characteristics depending on an external magnetic field along a magnetic easy axis direction for a material and a thickness of a noble metal spacer layer in a magnetic device according to an example embodiment of the present disclosure.

Referring to FIG. 12A, a GMR magnetic device of a spin valve structure includes Ta (5.0 nm)/$Ni_{80}Fe_{20}$ (3.0 nm)/$Co_{90}Fe_{10}$ (1.8 nm)/Cu (2.2 nm)/$Co_{90}Fe_{10}$ (2.0 nm)/noble metal spacer layer/$Ir_{21}Mn_{79}$ (6.0 nm)/Ta (5.0 nm). A noble metal spacer layer 154 may be copper (Cu) or platinum (Pt). A subscript denotes a thickness of an Angstrom unit. An x-axis represents a magnetic field of an Oe unit, and a y-axis represents magnetization normalized as saturation magnetization. An external magnetic field is applied in a magnetic easy axis direction of a free layer. The GMR magnetic device exhibits hysteresis characteristics.

w/o is a sample in which a noble metal spacer layer is not inserted. $Pt_1Cu_0$ represents the noble metal spacer layer 154, Pt is present in 1 angstrom, and Cu is not present in 0 angstrom. The hysteresis characteristics are exhibited near a position where an external magnetic field in a magnetic easy axis direction is zero (0).

When a Wheatstone bridge sensor is constituted, it is necessary to inhibit a signal caused by an external magnetic field Hx of magnetic easy axis direction. To inhibit the signal caused by the external magnetic field Hx in the magnetic easy axis direction, points A and B, in which a slope of hysteresis is maximum, need to be disposed outside of a sensing region. A bias magnetic field $H_{bias}$, a midpoint between the two points A and B in which the slope of hysteresis is maximum, needs to be proximate to zero.

Figure 12B:
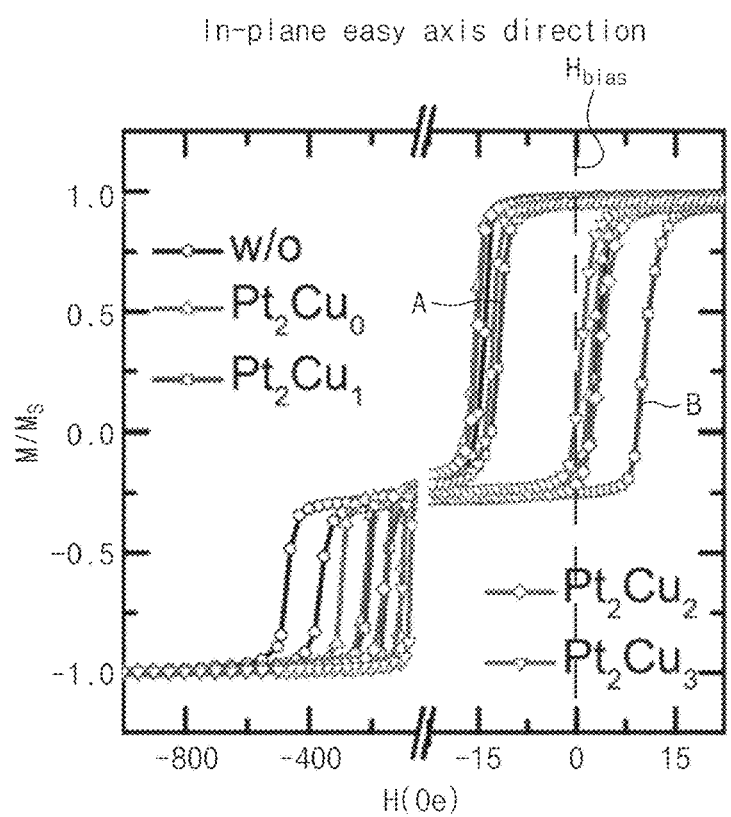

Referring to FIG. 12B, a sample of $Pt_1Cu_1$ has a wider sensing region than a sample w/o in which the noble metal spacer layer 154 is not inserted. A bias magnetic field $H_{bias}$, a midpoint between two points A and B in which a slope of hysteresis is maximum, has a minimum value.

Continuing to refer to FIG. 12B, a sample of $Pt_2Cu_1$ has a wider sensing region than the sample w/o in which the noble metal spacer layer 154 is not inserted. A bias magnetic field Hbias, a midpoint between two points A and B in which a slope of hysteresis is maximum, has a minimum value.

Figure 12C:
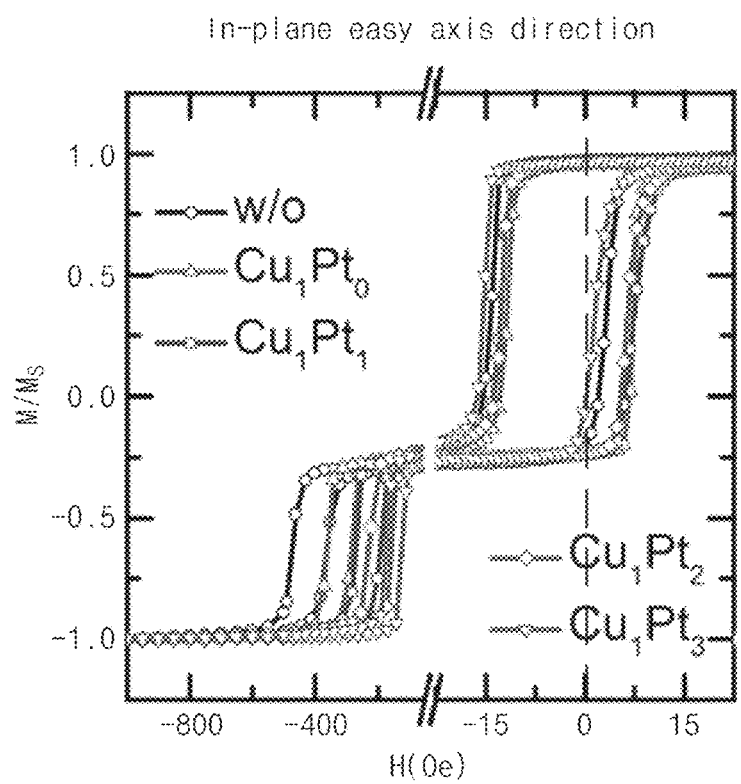

Referring to FIG. 12C, a sample of $Cu_2Pt_1$ has a wider sensing region than the sample w/o in which the noble metal spacer layer 154 is not inserted. A bias magnetic field $H_{bias}$, a midpoint between two points A and B in which a slope of hysteresis is maximum, has a minimum value.

Figure 12D:
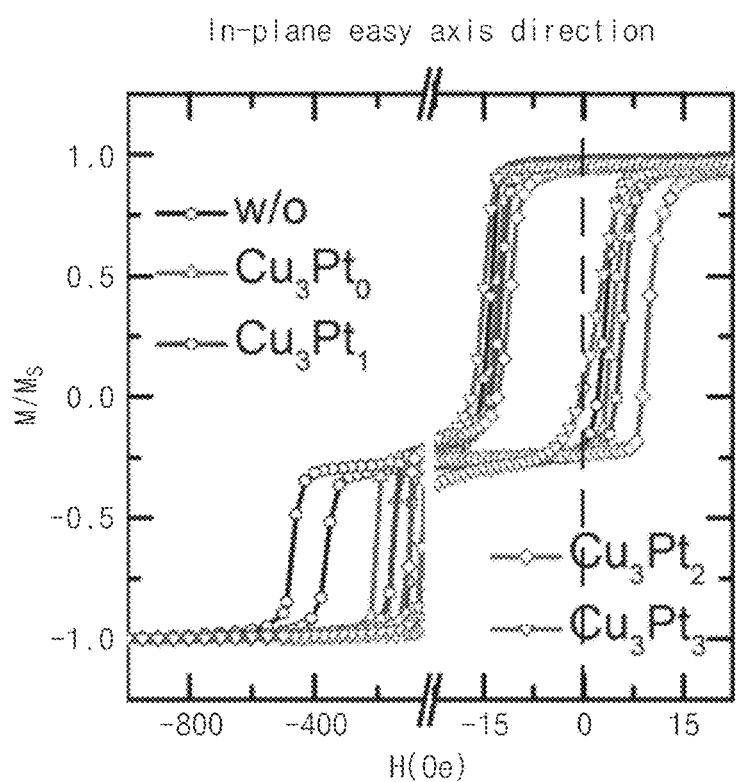

Referring to FIG. 12D, a sample of $Cu_3Pt_2$ has a wider sensing region than the sample w/o in which the noble metal spacer layer 154 is not inserted. A bias magnetic field $H_{bias}$, a midpoint between two points A and B in which a slope of hysteresis is maximum, has a minimum value.

When the noble metal spacer layer 154 is inserted between an antiferromagnetic layer 156 and a pinned layer 152, the magnitude of a free layer magnetization reversal magnetic field from an antiparallel state to a parallel state is adjusted. As a result, the bias magnetic field $H_{bias}$ of the free layer 130 may be reduced. In particular, a great effect may be obtained when a double layer is used than when a single layer is used.

Figure 13:
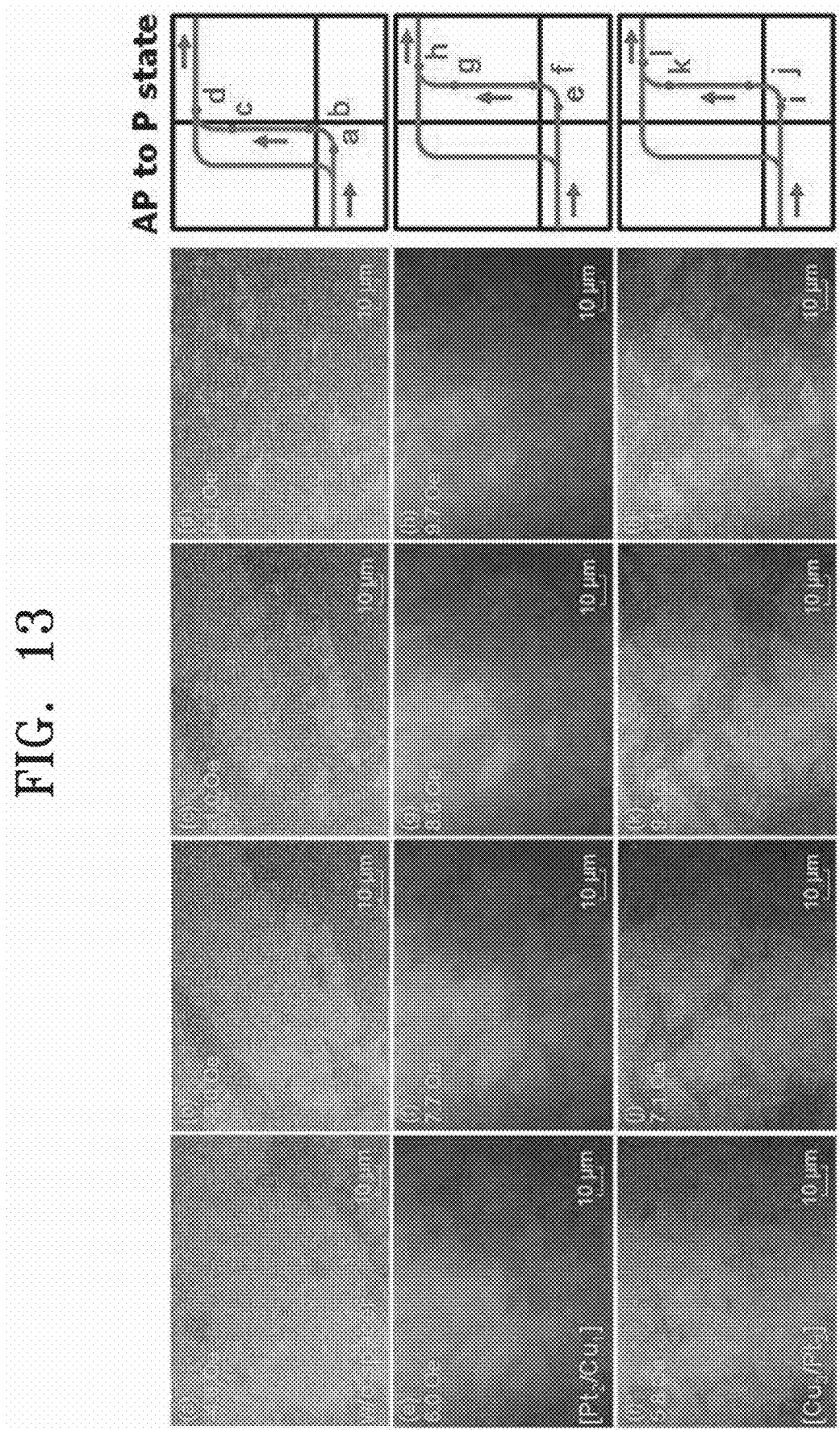
FIG. 13 illustrates a magneto-optic Kerr effect (MOKE) microscope image and hysteresis characteristics depending on whether there is a noble metal spacer layer in a magnetic device according to an example embodiment of the present disclosure.
Figure 14A:
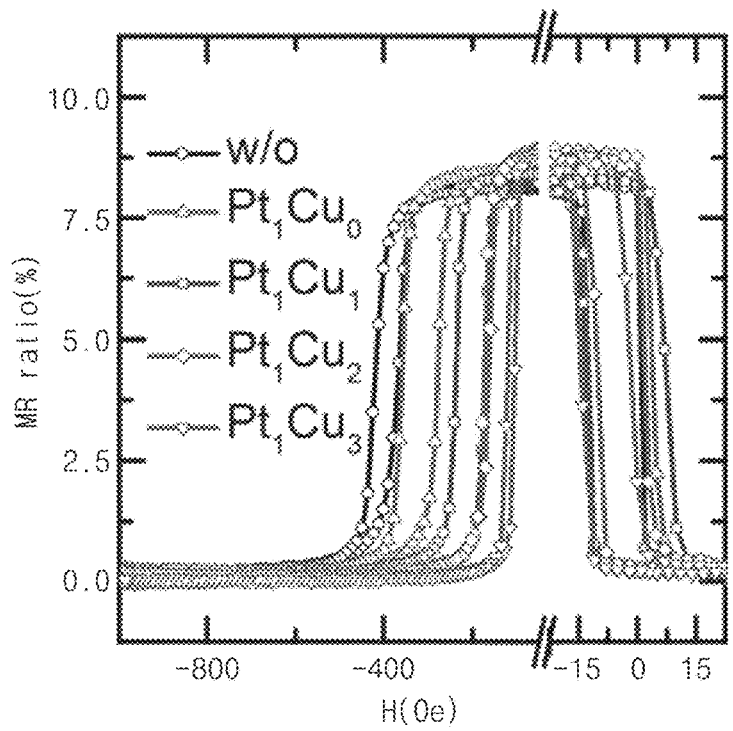
FIGS. 14A to 14D are graphs representing test results illustrating a magnetoresistance ratio depending on an external magnetic field along a magnetic easy axis direction in a magnetic device according to an example embodiment of the present disclosure.
Figure 14B:
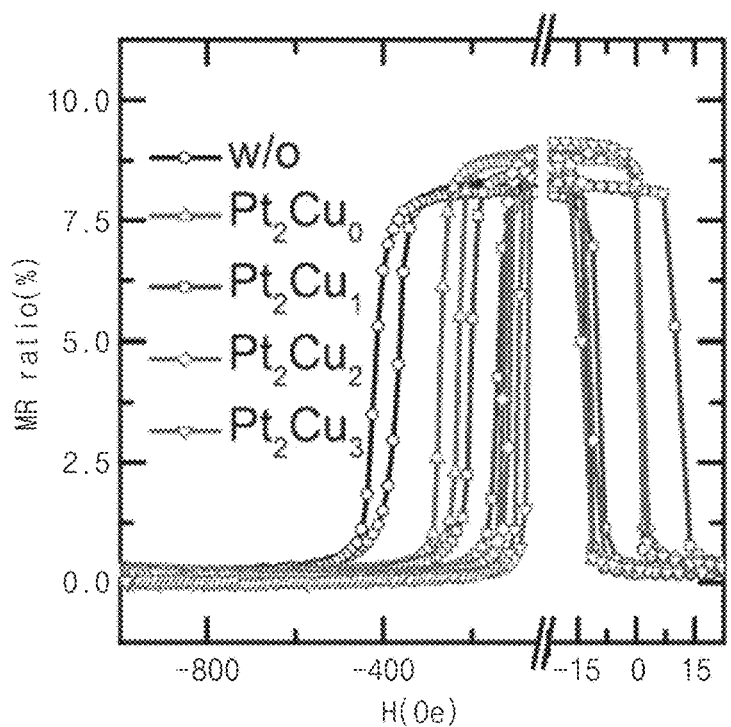
Figure 14C:
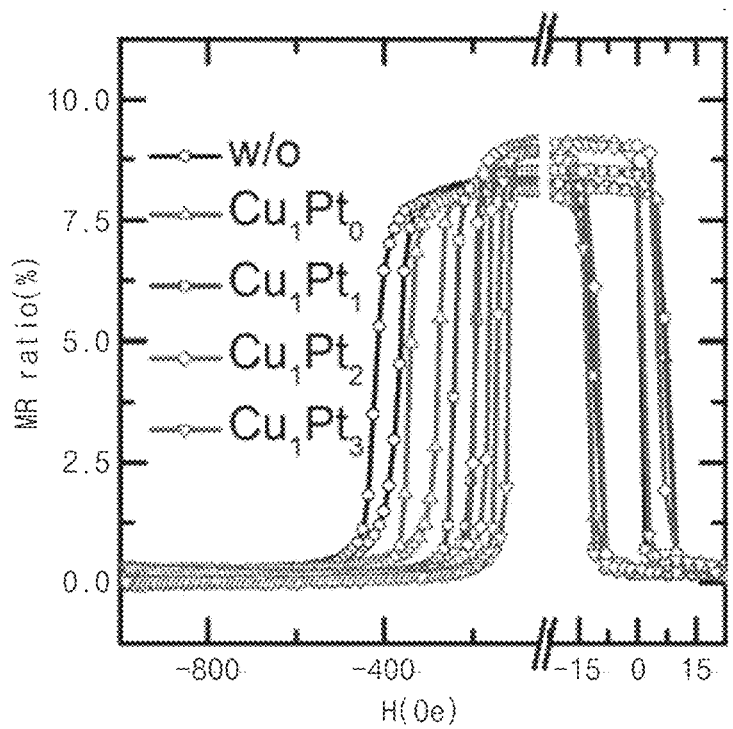
Figure 14D:
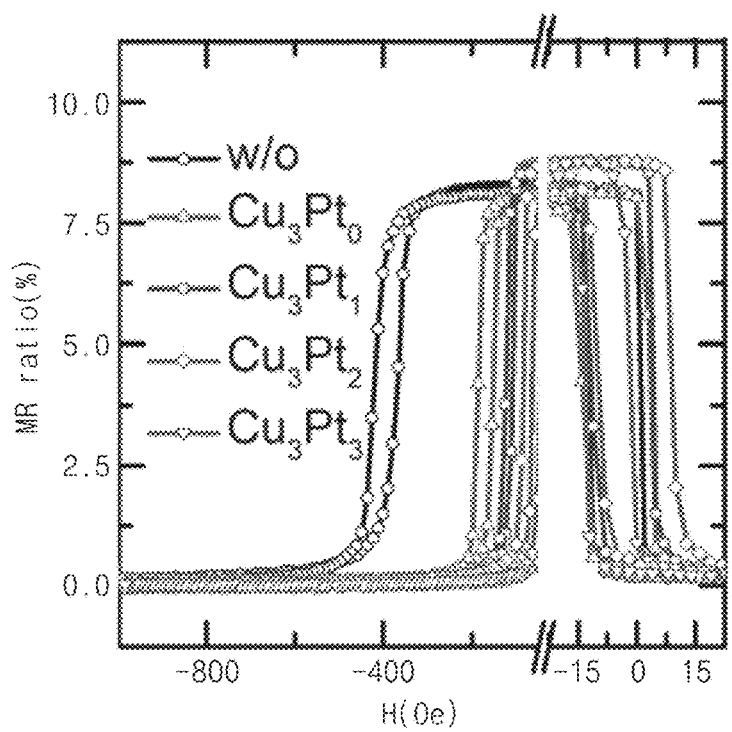

FIG. 13 illustrates a magneto-optic Kerr effect (MOKE) microscope image and hysteresis characteristics depending on whether there is a noble metal spacer layer in a magnetic device according to an example embodiment of the present disclosure.

Referring to FIG. 13, a behavior of a domain wall during a magnetization reversal process of a free layer 130 from an antiparallel state to a parallel state of a giant magnetoresistance thin film having a spin valve structure was observed in the range of several Oe to several tens of Oe, and a MOKE microscope of the behavior is displayed. A procedure is briefly illustrated in a right graph. In FIG. 13, (a) to (d) are sample in which a noble metal spacer layer 154 is not inserted, (e) to (h) are samples in which a noble metal spacer layer 154 is inserted in the form of a double layer including a Pt layer having thickness of 2 angstroms and a Cu layer having a thickness of 1 angstrom, and (i) to (l) are samples in which a noble metal spacer layer 154 is inserted in the form of a double layer including a Cu layer having a thickness of 3 angstroms and a Pt layer having a thickness of 2 angstroms. A pinned layer 152 is tightly pinned in a direction of an exchange bias magnetic field by an antiferromagnetic layer 156. Thus, density of a free layer 130 is higher than that of the antiferromagnetic layer 156 because the free layer 130 exhibits a single magnetic domain behavior.

Referring to (a) to (d), when the noble metal spacer layer 154 is not inserted, there is no foreign substance in the antiferromagnetic layer 156. Accordingly, since density of a Néel magnetic wall is not high, there is less flux-closure which fixes migration of a magnetic domain wall in a magnetization reversal process. As a result, a size of the magnetic domain is generally large, and the magnetic domain wall migrates smoothly.

Referring to (e) to (h) and (i) to (l), when the noble metal spacer layer 154 is inserted, noble metal atoms of the noble metal spacer layer 154 act as foreign substances in the antiferromagnetic layer 156. Accordingly, the noble metal spacer layer 154 increases the density of the Néel domain wall, and the increased Néel domain wall in the antiferromagnetic layer 156 forms flux-closure due to the Neel domain wall in the free layer 130 and a magnetostatic interaction caused by the domain wall. Thus, the noble metal spacer layer 154 serves as a pinning site in a free layer magnetization reversal process from an antiparallel state to a parallel state. As a result, the bias magnetic field $H_{bias}$ is decreased due to an increase in the magnitude of the magnetization reversal magnetic field from the antiparallel state to the parallel state of the free layer 130.

FIGS. 14A to 14D are graphs representing test results illustrating a magnetoresistance ratio depending on an external magnetic field along a magnetic easy axis direction in a magnetic device according to an example embodiment of the present disclosure.

Figure 15:
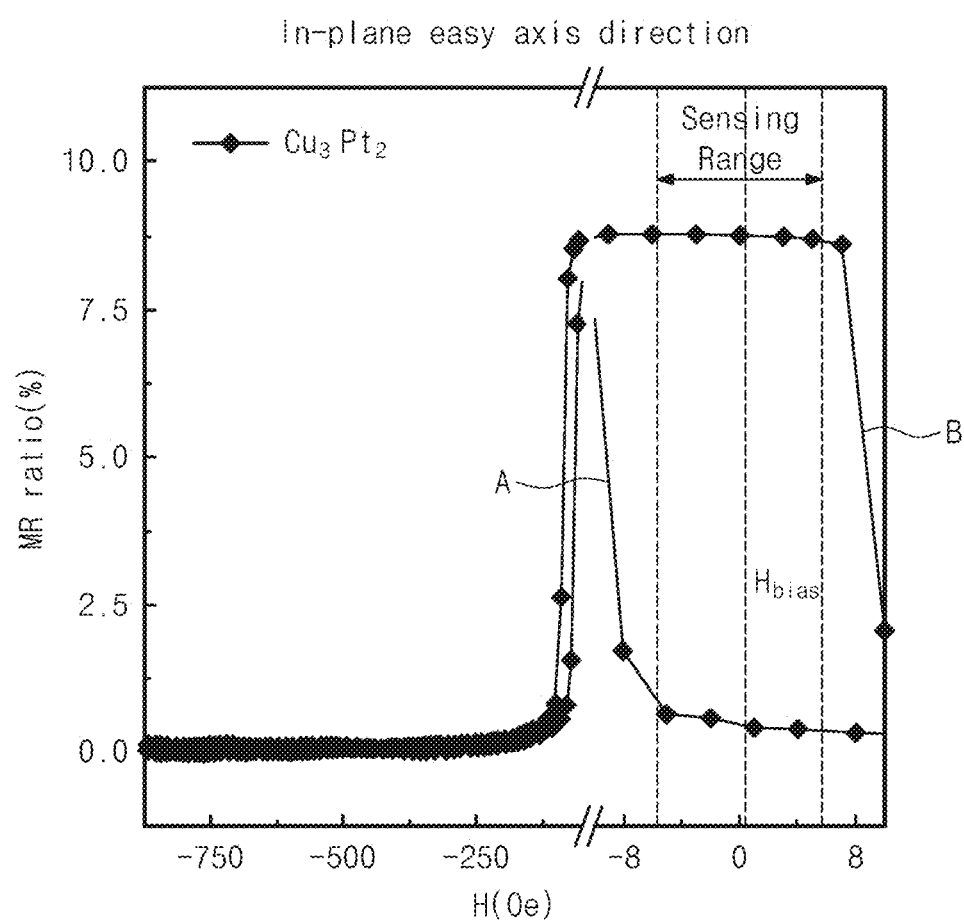
FIG. 15 is a graph of enlarging a magnetoresistance ratio under $Cu_3Pt_2$ in FIGS. 14A to 14D.
Figure 16A:
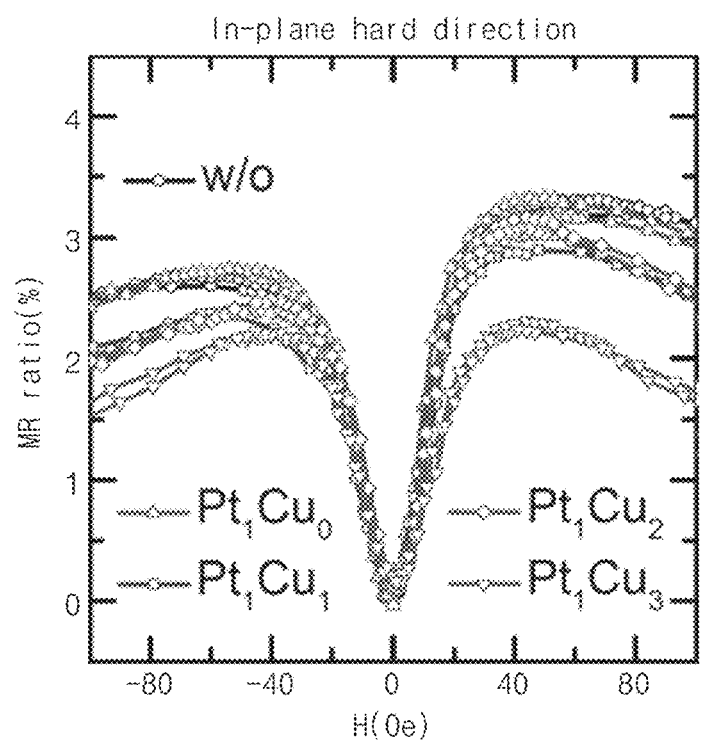
FIGS. 16A to 16D are graphs representing test results illustrating a magnetoresistance ratio depending on an external magnetic field along a magnetic hard axis direction in a magnetic device according to an example embodiment of the present disclosure.
Figure 16B:
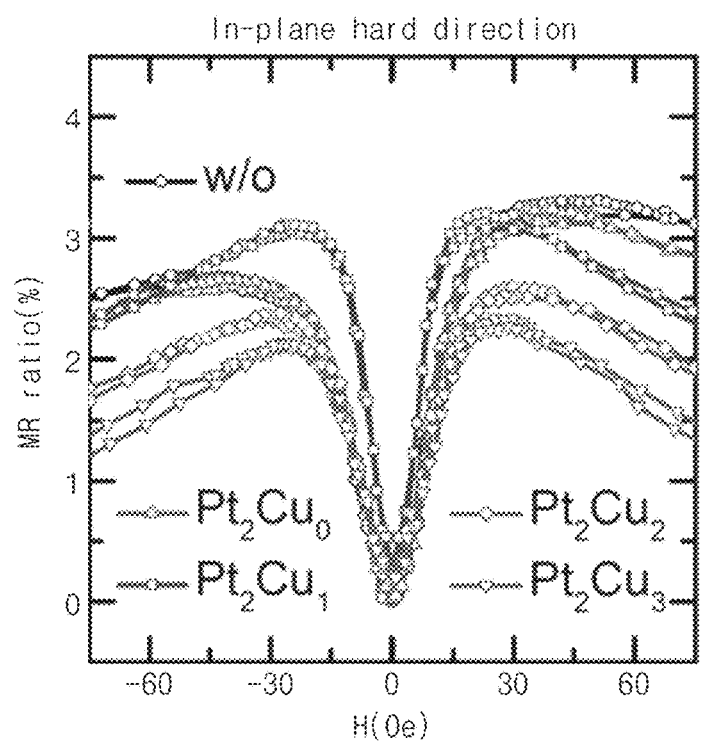
Figure 16C:
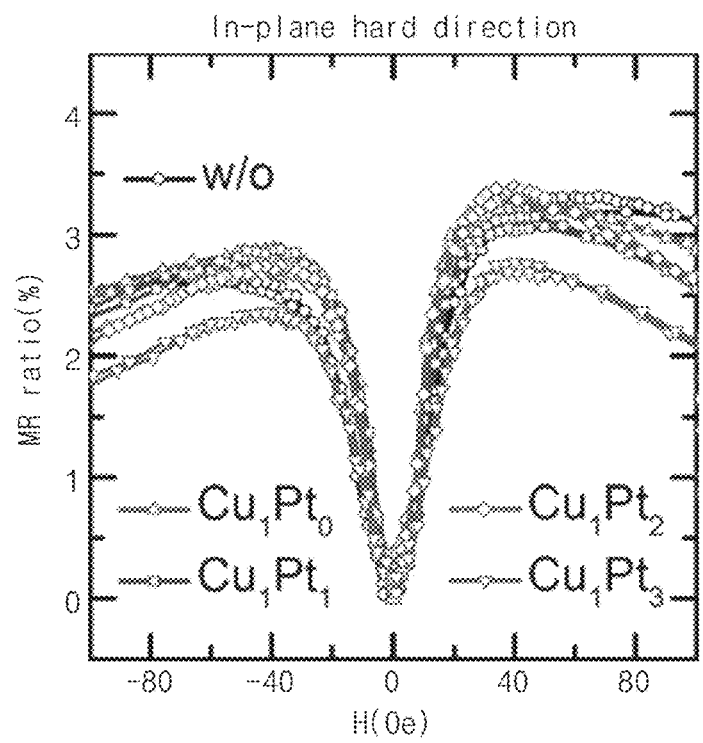
Figure 16D:
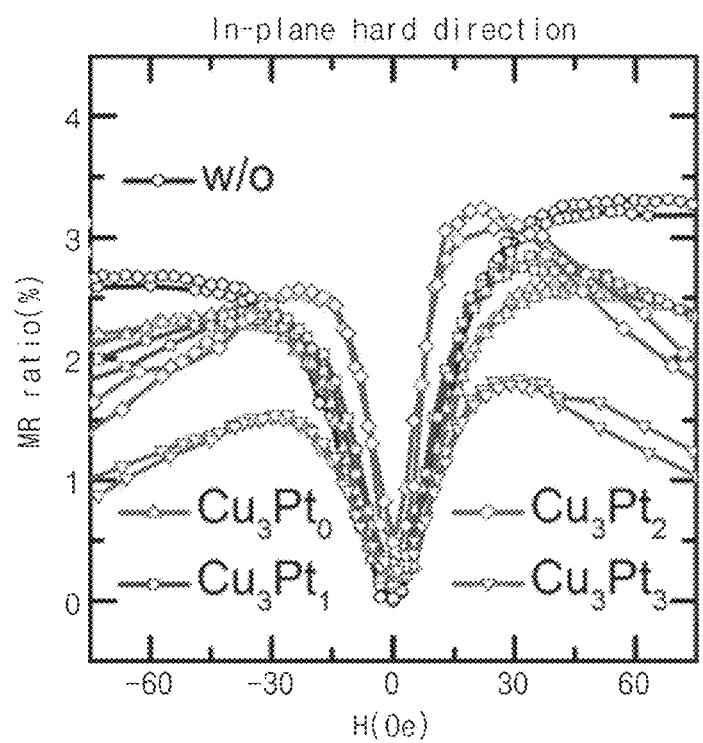

FIG. 15 is a graph of enlarging a magnetoresistance ratio under $Cu_3Pt_2$ in FIGS. 14A to 14D.

Referring to FIGS. 14A to 14D and FIG. 15, magnetoresistance ratios, depending on the presence or absence of a noble metal spacer layer 154, are shown. An external magnetic field Hx is applied along a magnetic easy axis direction of a free layer 130. When the noble metal spacer layer 154 is inserted, the magnitude of a free layer magnetization reversal magnetic field from an antiparallel state to a parallel state is increased by a magnetostatic interaction effect caused by a Néel magnetic wall. Thus, a resultant bias magnetic field $H_{bias}$ of the free layer decreases. In addition, when the noble metal spacer layer 154 is inserted, the magnitude of a giant magnetoresistance ratio is increased by electronic specular scattering of electrons on upper and lower boundaries of the noble metal spacer layer 154.

When a structure of the noble metal spacer 154 is a condition of $Cu_3Pt_2$, a magnetoresistance ratio exhibits a hysteresis characteristic. Regions, in which the magnetoresistance ratio is rapidly increased, are disposed outside of a sensing region (−6 Oe to +6 Oe) centering on 0 Oe, and a bias magnetic field $H_{bias}$ is 0.5 Oe proximate to 0. Accordingly, in a Wheatstone bridge structure, a signal, generated by the external magnetic field Hx along the magnetic easy axis direction, may be inhibited. In the Wheatstone bridge structure, only a signal, generated by the external magnetic field Hy along a magnetic hard axis direction, may be measured.

FIGS. 16A to 16D are graphs representing test results illustrating a magnetoresistance ratio depending on an external magnetic field along a magnetic hard axis direction in a magnetic device according to an example embodiment of the present disclosure.

Referring to FIGS. 16A to 16D, magnetoresistance ratios, depending on the presence or absence of a noble metal spacer layer 154, are shown. An external magnetic field Hy is applied in a magnetic hard axis direction of a free layer 130. In an external magnetic field range from 0 to 10 Oe, a slope of the magnetoresistance ratio has a direct effect on sensitivity (S). The greater the magnitude of a bias magnetic field $H_{bias}$ of the free layer 130, the higher the slope of the magnetoresistance ratio. A free layer magnetization reversal magnetic field from an antiparallel state to a parallel state is increased by a magnetostatic interaction effect resulting from a magnetic domain wall. Accordingly, even if coercive force of the free layer 130 is increased, sensitivity of a GMR element is increased when the bias magnetic field $H_{bias}$ of the free layer 130 is decreased.

Figure 17:
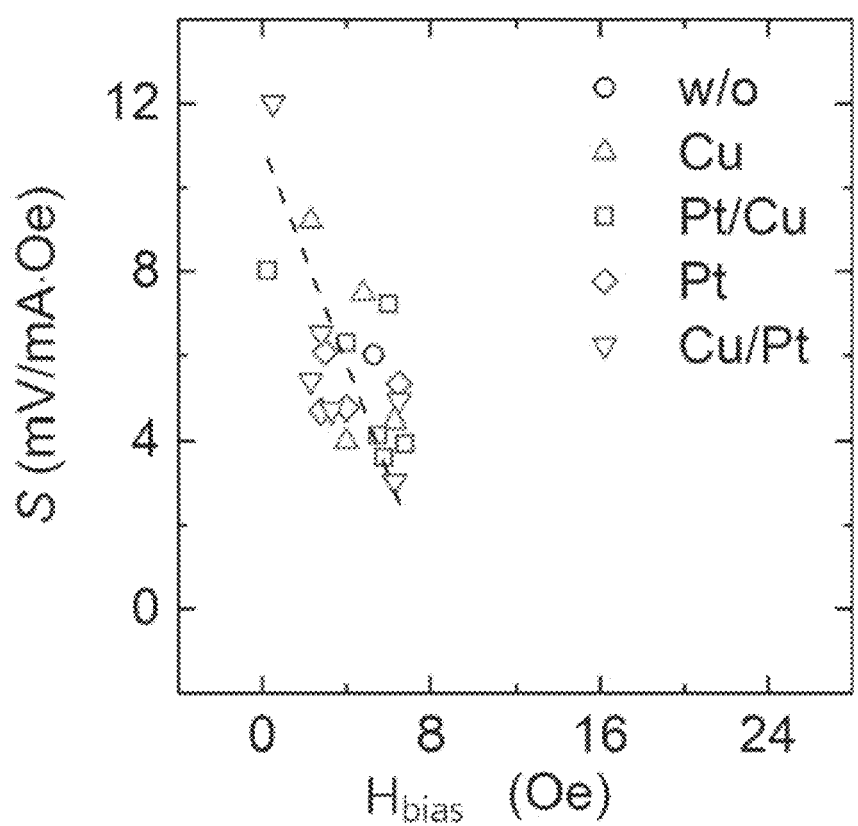
FIG. 17 are graphs illustrating a correlation between sensitivity (S) and a bias magnetic field ($H_{bias}$) of a free layer in a magnetic device according to an example embodiment of the present disclosure.

FIG. 17 are graphs illustrating a correlation between sensitivity (S) and a bias magnetic field ($H_{bias}$) of a free layer in a magnetic device according to an example embodiment of the present disclosure.

Referring to FIG. 17, sensitivity (S) and a bias magnetic field ($H_{bias}$) of a free layer 130 have a strong negative correlation with each other. When a noble metal spacer layer 154 is not inserted, the bias magnetic field $H_{bias}$ is 5.3 Oe and the sensitivity (S) is 6.01 mV/mA·Oe. When a [$Pt_2/Cu_1$] double layer is inserted as a noble metal spacer layer 154, a bias magnetic field $H_{bias}$ is 0.25 Oe and the sensitivity (S) is 8.02 mV/mA·Oe. When a [$Cu_3/Pt_2$] double layer is inserted as the noble metal spacer layer 154, the bias magnetic field $H_{bias}$ is 0.5 Oe and the sensitivity (S) is 12.01 mV/mA·Oe.

Figure 18:
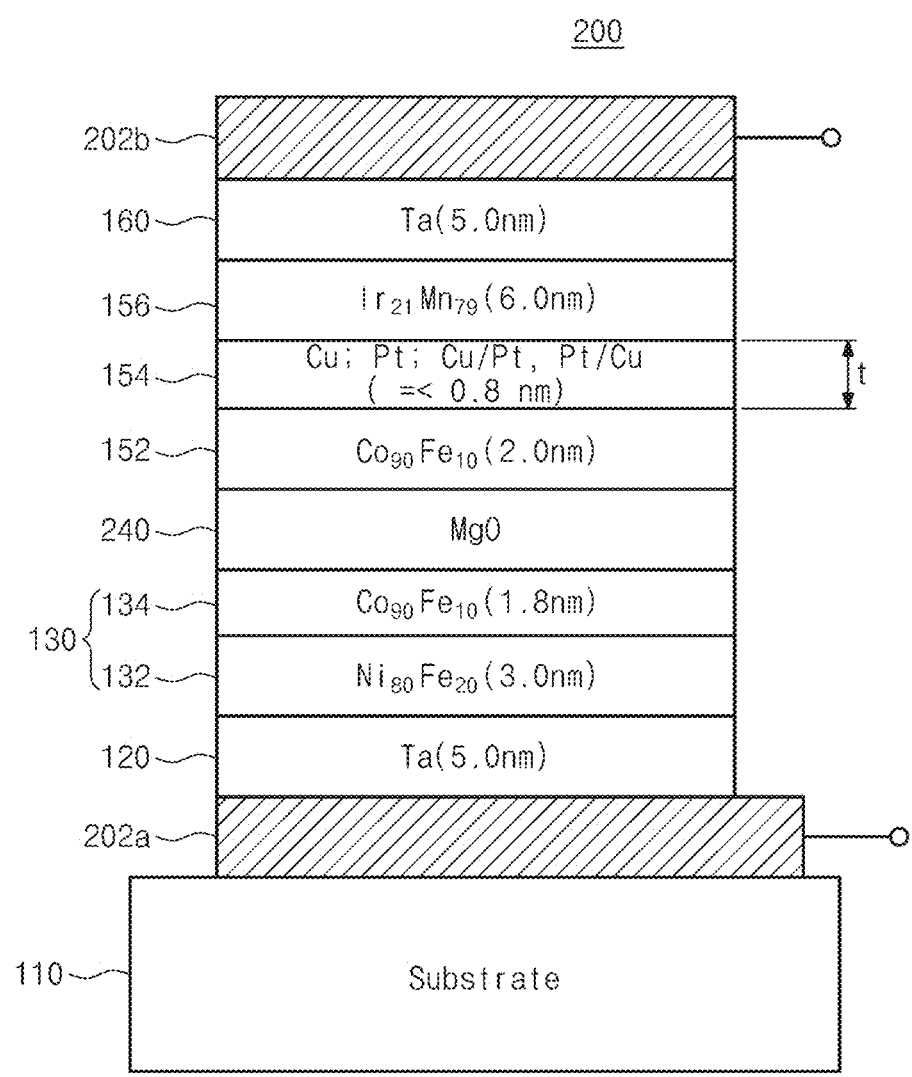
FIG. 18 is a cross-sectional view of a magnetic device according to another example embodiment of the present disclosure.

FIG. 18 is a cross-sectional view of a magnetic device according to another example embodiment of the present disclosure.

Referring to FIG. 18, a magnetic device 200 includes a pinned layer 152 having an in-plane magnetization direction, a free layer 130, having an in-plane magnetization direction, vertically spaced apart from the pinned layer 152 to be aligned with the pinned layer 152, a tunnel insulating layer 140 disposed between the pinned layer 152 and the free layer 130, an antiferromagnetic layer 156 disposed to pin the magnetization direction of the pinned layer 152 and vertically spaced apart from the pinned layer 152 to be aligned with the pinned layer 152, and a noble metal spacer layer 154 disposed between the pinned layer 152 and the antiferromagnetic layer 156. The noble metal spacer layer 154 may be a single-layer thin film of copper or platinum, or a multilayer thin film of copper and platinum, and may have a thickness of 0.1 to 0.8 nm. The free layer 130 has shape magnetic anisotropy, and the magnetic device 200 may be connected with a Wheatstone bridge structure.

In the magnetic device 200 using a tunnel magnetoresistance effect, the metal spacer layer 140 of the magnetic device 100 using a giant magnetoresistance effect may be replaced with a tunnel insulating layer 240. Electrodes 202a and 202b may be disposed on top and bottom surfaces of the magnetic device 200. In the magnetic device 200, the noble metal spacer layer 154 is inserted to reduce a bias magnetic field $H_{bias}$ in a magnetic easy axis due to an effect similar to that of a giant magnetoresistance element.

The tunnel insulating layer 240 may be MgO, AlOx, or GdOx. The tunnel insulating layer 240 may have a thickness of several nanometers (nm).

The noble metal spacer layer 154 is $Pt_2Cu_1$, $Cu_2Pt_1$, or $Cu_3Pt_2$, and a subscript denotes a thickness of an Angstrom unit.

The pinned layer 154 may be CoFe, and the free layer 130 may include a first ferromagnetic layer 132 of NiFe and a second ferromagnetic layer 134 of CoFe.

As described above, in a magnetic device according to an example embodiment, a noble metal spacer layer may be inserted between an antiferromagnetic layer and a pinned layer to adjust a sensitivity value in a magnetic hard axis direction of the magnetic device.

In a magnetic device according to an example embodiment, a noble metal spacer layer may be inserted between a ferromagnetic layer and a pinned layer to increase a sensing range of a bias magnetic field in a magnetic hard axis direction of the magnetic device.

In a magnetic device according to an example embodiment, a noble metal spacer layer may be inserted between an antiferromagnetic layer and a pinned layer to reduce a bias magnetic field in a magnetic easy axis direction of the magnetic device.

In a magnetic device according to an example embodiment, a noble metal spacer layer may be inserted between an antiferromagnetic layer and a pinned layer to increase density of a Néel domain wall, capable of improving a magnetostatic interaction caused by a magnetic domain wall, and to increase flux-closure such that a magnetization reversal magnetic field of a free layer, in which magnetization reversal from an antiparallel state to a parallel state occurs, is significantly increased. As a result, a bias magnetic field of the free layer may be reduced to improve sensitivity along a magnetic hard axis direction.

In an ultra-thin noble metal space layer of a magnetic device according to an example embodiment, a noble metal spacer layer may be inserted between an antiferromagnetic layer and a pinned layer such that density of a Néel domain wall of the pinned layer may be adjusted to control a bias magnetic field of the free layer. In addition, the noble metal spacer layer may cause specular scattering on upper and lower boundaries to increase a magnetoresistance value.

Although the present disclosure and its advantages have been described in detail, it should be understood that various changes, substitutions and alterations n be made herein without departing from the spirit and scope of the disclosure as defined by the following claims.

What is claimed is:

1. A magnetic device comprising:
a pinned layer having an in-plane magnetization direction;
a free layer, having an in-plane magnetization direction, vertically spaced apart from the pinned layer to be aligned with the pinned layer;
a conductive spacer layer disposed between the pinned layer and the free layer;
an antiferromagnetic layer disposed to pin the magnetization direction of the pinned layer and vertically spaced apart from the pinned layer to be aligned with the pinned layer; and
a noble metal spacer layer disposed between the pinned layer and the antiferromagnetic layer,
wherein the pinned layer comprises CoFe, and the free layer comprises a first ferromagnetic layer of NiFe separated from the conductive spacer by a second ferromagnetic layer of CoFe disposed in contact with the conductive spacer and the first ferromagnetic layer.

2. The magnetic device as set forth in claim 1, wherein the noble metal spacer layer is a single-layer thin film of copper or platinum, or a multilayer thin film of copper and platinum, and the noble metal spacer layer has a thickness of 0.1 to 0.8 nanometer (nm).

3. The magnetic device as set forth in claim 1, wherein the free layer has shape magnetic anisotropy, and the magnetic device is connected with a Wheatstone bridge structure.

4. The magnetic device as set forth in claim 1, wherein the conductive spacer layer comprises copper and has a thickness of 2.2 nm.

5. The magnetic device as set forth in claim 1, wherein the noble metal spacer layer comprises $Pt_2Cu_1$, $Cu_2Pt_1$, or $Cu_3Pt_2$, where each subscript denotes a thickness of an Angstrom unit.

6. A magnetic device comprising:
a pinned layer having an in-plane magnetization direction;
a free layer, having an in-plane magnetization direction, vertically spaced apart from the pinned layer to be aligned with the pinned layer;
a conductive spacer layer disposed between the pinned layer and the free layer;

an antiferromagnetic layer disposed to pin the magnetization direction of the pinned layer and vertically spaced apart from the pinned layer to be aligned with the pinned layer; and a noble metal spacer layer disposed between the pinned layer and the antiferromagnetic layer, wherein the free layer has a shape magnetic anisotropy along an extension direction of the magnetic device, and wherein the in-plane magnetization direction of the pinned layer is at an angle of 45 degrees in the extension direction of the magnetic device.

7. The magnetic device as set forth in claim 6, wherein the free layer has shape magnetic anisotropy, and the magnetic device is connected with a Wheatstone bridge structure.

8. The magnetic device as set forth in claim 6, wherein the conductive spacer layer comprises copper and has a thickness of 2.2 nm.

9. The magnetic device as set forth in claim 6, wherein the pinned layer comprises CoFe, and the free layer comprises a first ferromagnetic layer of NiFe and a second ferromagnetic layer of CoFe.

10. The magnetic device as set forth in claim 6, wherein the noble metal spacer layer has a thickness of 0.1 to 0.8 nanometer (nm).

11. The magnetic device as set forth in claim 6, wherein the noble metal spacer is a single layer thin film of platinum or a multilayer thin film of copper and platinum.

12. A magnetic device comprising:
a pinned layer having an in-plane magnetization direction;
a free layer, having an in-plane magnetization direction, vertically spaced apart from the pinned layer to be aligned with the pinned layer;
a conductive spacer layer disposed between the pinned layer and the free layer;
an antiferromagnetic layer disposed to pin the magnetization direction of the pinned layer and vertically spaced apart from the pinned layer to be aligned with the pinned layer;
a noble metal spacer layer disposed between the pinned layer and the antiferromagnetic layer; and
a pair of electrodes disposed perpendicular to and in contact with the pinned layer, the free layer, the conductive spacer layer, the antiferromagnetic layer, and the noble metal spacer at both sides of the magnetic device.

13. The magnetic device as set forth in claim 12, wherein the free layer has shape magnetic anisotropy, and the magnetic device is connected with a Wheatstone bridge structure.

14. The magnetic device as set forth in claim 12, wherein the conductive spacer layer comprises copper and has a thickness of 2.2 nm.

15. The magnetic device as set forth in claim 12, wherein the noble metal spacer layer comprises $Pt_2Cu_1$, $Cu_2Pt_1$, or $Cu_3Pt_2$, where each subscript denotes a thickness of an Angstrom unit.

16. The magnetic device as set forth in claim 12, wherein the pinned layer comprises CoFe, and the free layer comprises a first ferromagnetic layer of NiFe and a second ferromagnetic layer of CoFe.

17. The magnetic device as set forth in claim 12, wherein the noble metal spacer layer has a thickness of 0.1 to 0.8 nanometer (nm).

18. The magnetic device as set forth in claim 12, wherein the noble metal spacer is a single layer thin film of platinum or a multilayer thin film of copper and platinum.

* * * * *